(12) United States Patent
Stockstad

(10) Patent No.: US 8,902,089 B2
(45) Date of Patent: Dec. 2, 2014

(54) SYSTEMS AND METHODS FOR PERFORMING DIGITAL MODULATION

(71) Applicant: QUALCOMM Incorporated, San Diego, CA (US)

(72) Inventor: Troy Stockstad, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/717,217

(22) Filed: Dec. 17, 2012

(65) Prior Publication Data

US 2013/0293404 A1    Nov. 7, 2013

Related U.S. Application Data

(60) Provisional application No. 61/641,577, filed on May 2, 2012.

(51) Int. Cl.
| | |
|---|---|
| H03M 7/32 | (2006.01) |
| H03K 7/08 | (2006.01) |
| H03M 3/00 | (2006.01) |
| H04L 25/49 | (2006.01) |

(52) U.S. Cl.
CPC . *H03M 3/30* (2013.01); *H03K 7/08* (2013.01); *Y02B 20/346* (2013.01); *H04L 25/4902* (2013.01)
USPC ............................. 341/77; 341/114; 341/143

(58) Field of Classification Search
USPC ................... 341/144, 143, 155, 157, 77, 114; 375/298, 264, 261
See application file for complete search history.

(56) References Cited

U.S. PATENT DOCUMENTS

| | | | | | |
|---|---|---|---|---|---|
| 3,946,273 | A | * | 3/1976 | Goddard | 315/297 |
| 4,110,834 | A | * | 8/1978 | Altwein | 708/835 |
| 4,620,157 | A | * | 10/1986 | Hayashi | 327/356 |
| 4,660,162 | A | * | 4/1987 | Berlinsky | 708/290 |
| 5,103,462 | A | * | 4/1992 | Elle et al. | 375/238 |
| 5,862,069 | A | * | 1/1999 | Nestler | 708/620 |
| 6,285,306 | B1 | * | 9/2001 | Zrilic | 341/143 |
| 6,987,787 | B1 | | 1/2006 | Mick | |
| 6,990,155 | B2 | * | 1/2006 | Adachi et al. | 375/298 |
| 7,944,652 | B2 | | 5/2011 | Fukumoto | |
| 7,944,715 | B2 | * | 5/2011 | Zhang et al. | 363/21.02 |
| 8,120,280 | B2 | | 2/2012 | Yi et al. | |
| 8,232,902 | B2 | | 7/2012 | Filippo et al. | |
| 2005/0243580 | A1 | | 11/2005 | Lyle, Jr. et al. | |
| 2009/0073110 | A1 | | 3/2009 | Feng | |
| 2011/0227496 | A1 | | 9/2011 | Lin et al. | |
| 2012/0043901 | A1 | | 2/2012 | Nanbu | |
| 2012/0176048 | A1 | | 7/2012 | Li et al. | |

OTHER PUBLICATIONS

International Search Report and Written Opinion—PCT/US2013/039342—ISA/EPO—Aug. 8, 2014.

* cited by examiner

*Primary Examiner* — Peguy Jean Pierre

(57) ABSTRACT

Circuitry for performing digital modulation is described. The circuitry includes a digital modulator. The digital modulator receives a first signal with a first duty cycle. The digital modulator also receives a second signal with a second duty cycle. The digital modulator further produces a monotonic multiplied modulated signal based on the first signal and the second signal.

40 Claims, 12 Drawing Sheets

SYSTEMS AND METHODS FOR PERFORMING DIGITAL MODULATION

CLAIM OF PRIORITY UNDER 35 U.S.C. 119

The present application for patent claims priority to Provisional Application No. 61/641,577, entitled "Digital modulator for lighting dimming control supporting an additional external PWM input" filed May 2, 2012, and assigned to the assignee hereof and hereby expressly incorporated by reference herein.

TECHNICAL FIELD

The present disclosure relates generally to signal processing. More specifically, the present disclosure relates to systems and methods for performing digital modulation.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. For example, electronic devices that perform functions faster, more efficiently or with higher quality are often sought after.

As the use of electronic devices has proliferated, their size, implementation cost, power efficiency and features have taken increasing importance. For example, consumers may prefer to use electronic devices that offer better power efficiency (e.g., battery performance), smaller size, lower cost and additional features.

However, adding more features often comes as a tradeoff to larger size, reduced power efficiency and/or additional cost. For instance, additional features may require additional die area and/or may consume more power. Accordingly, features that are designed in a way that requires reduced space, better power efficiency and/or lower implementation cost may be beneficial.

SUMMARY

Circuitry for performing digital modulation is described. The circuitry includes a digital modulator. The digital modulator receives a first signal with a first duty cycle. The digital modulator also receives a second signal with a second duty cycle. The digital modulator further produces a monotonic multiplied modulated signal based on the first signal and the second signal.

The second signal may be received from an external source. The second signal may be a single-bit modulation signal. The digital modulator may utilize the second signal as a hold signal.

The monotonic multiplied modulated signal may be a pulse-width modulated signal or a sigma-delta modulated signal. The digital modulator may provide the monotonic multiplied modulated signal to a dimmer. The dimmer may perform analog dimming and/or digital dimming based on the monotonic multiplied modulated signal. A third duty cycle of the monotonic multiplied modulated signal may be a product of the first duty cycle and the second duty cycle.

The digital modulator may include a first adder that subtracts an accumulator output from the first signal. The digital modulator may also include an accumulator coupled to the first adder. The accumulator may provide the accumulator output based on a first adder output and the second signal. The digital modulator may further include an AND gate coupled to the accumulator. The AND gate may produce the monotonic multiplied modulated signal based on the accumulator output and the second signal. The digital modulator may operate in a sigma-delta modulation mode or a pulse-width modulation mode based on a mode signal.

The accumulator may include a second adder coupled to the first adder. The second adder may add the first adder output to the accumulator output. The accumulator may also include a delay coupled to the second adder and to the AND gate. The delay may delay a second adder output.

The digital modulator may include a truncator coupled to the accumulator and to the AND gate. The truncator may truncate the accumulator output.

A method for performing digital modulation by circuitry is also described. The method includes receiving a first signal with a first duty cycle. The method also includes receiving a second signal with a second duty cycle. The method further includes producing a monotonic multiplied modulated signal based on the first signal and the second signal.

A computer-program product for performing digital modulation is also described. The computer-program product includes a non-transitory tangible computer-readable medium with instructions. The instructions include code for causing circuitry to receive a first signal with a first duty cycle. The instructions also include code for causing the circuitry to receive a second signal with a second duty cycle. The instructions further include code for causing the circuitry to produce a monotonic multiplied modulated signal based on the first signal and the second signal.

An apparatus for performing digital modulation is also described. The apparatus includes means for receiving a first signal with a first duty cycle. The apparatus also includes means for receiving a second signal with a second duty cycle. The apparatus further includes means for producing a monotonic multiplied modulated signal based on the first signal and the second signal.

DETAILED DESCRIPTION

Figure 1:
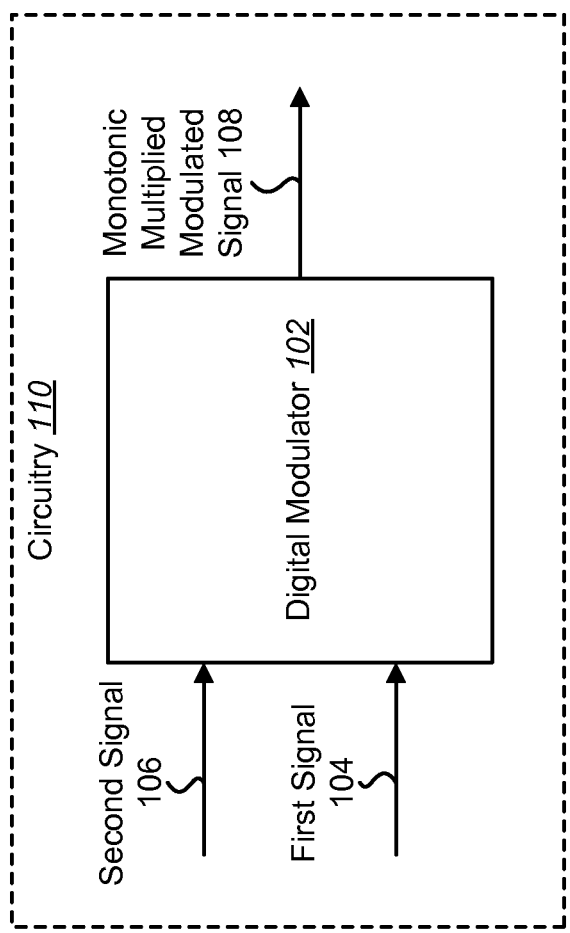
FIG. 1 is a block diagram illustrating one configuration of circuitry for performing digital modulation.

The systems and methods disclosed herein may be applied to a variety of electronic devices. Examples of electronic devices include circuitry, integrated circuits, televisions, monitors, projectors, cellular phones, smartphones, voice recorders, video cameras (e.g., camcorders), audio players (e.g., Moving Picture Experts Group-1 (MPEG-1) or MPEG-2 Audio Layer 3 (MP3) players), video players, audio recorders, desktop computers, laptop computers, personal digital assistants (PDAs), gaming systems, etc. One kind of electronic device is a communication device, which may communicate with another device. Examples of communication devices include telephones, laptop computers, desktop computers, cellular phones, smartphones, wireless or wired modems, e-readers, tablet devices, gaming systems, cellular telephone base stations or nodes, access points, wireless gateways and wireless routers, etc.

The systems and methods disclosed herein describe circuitry for performing digital modulation. In particular, a digital modulator that produces a monotonic multiplied modulated signal is described. In some configurations, the digital modulator may be utilized for lighting dimming control and may support an additional external pulse-width modulation input. For example, the digital modulator may be applied as a white light emitting diode (WLED) dimming modulator.

In some implementations, the digital modulator may support an additional pulse-width modulation input and produce a single bit output that is a function of the multiple of the internal and external modulation duty cycles. This may be used for backlight dimming control. For example, the systems and methods disclosed herein may utilize an external pulse-width modulation input as a "hold" input for the accumulator state for a sigma-delta modulator or a "hold" input for counters used to create a pulse-width modulation output.

The overall modulator output may be ANDed with the external pulse-width modulation signal (e.g., the logical "AND" of the modulator output and the external pulse-width modulation signal may be determined). For example, the modulator output and the external pulse-width modulation signal may be provided to an AND gate to perform a logical "AND" operation. In this way, the internal modulation information is not lost, and the external pulse-width modulation signal is effectively multiplied by the internal modulation information.

Some configurations of the systems and methods disclosed herein provide a completely digital approach to supporting external pulse-width modulation inputs for lighting control. One advantage of this approach may be saving the addition of a potentially large or external filter to implement an analog solution. Another benefit of the systems and methods disclosed herein is that interaction between independent modulations may be avoided. In contrast, it may be difficult to avoid cross-talk in an analog implementation. In some implementations, the digital modulator may be embedded within and/or integrated into a power management circuit.

In some configurations, the systems and methods disclosed herein may relate to a digital modulator for dimming control in lighting applications that can receive an external content automatic backlight control (CABC) input. For example, desired functionality for the digital modulator and dimming control may be expressed as illustrated in Equation (1).

$$I_{LED} = I_{CS} \times D_A \times D_B \quad (1)$$

In Equation (1), $I_{LED}$ is a bias current corresponding to one or more light emitting diodes (LEDs) (that may be applied for display backlighting, for example), $I_{CS}$ is a current (e.g., a full scale current) provided by a current source, $D_A$ is a duty cycle of a first signal (e.g., an internal pulse-width modulation signal) and $D_B$ is a duty cycle of a second signal. In some configurations, the first signal may be a 12-bit internal pulse-width modulation signal. In some configurations, the second signal may be an external signal, such as a pulse-width modulation signal provided by a light sensor for content automatic backlight control (CABC). For example, the second signal may be a content automatic backlight control input that is a 1-bit digital signal. In some configurations, the duty cycle of the second signal (e.g., $D_B$) may range from 0% to 100% (e.g., 0%≤$D_B$≤100%). Additionally or alternatively, the input frequency of the second signal may range from 20 kilohertz (kHz) to 60 kHz, for example. It should be noted that a duty cycle may be independent of signal frequency in some configurations. A white light emitting diode module may modulate the light emitting diode bias current in conjunction with individual 12-bit pulse-width modulation control and the second signal or content adaptive backlight control input (as illustrated by Equation (1), for example).

Some approaches for dimming are described as follows. Current may be delivered to a string of light emitting diodes by a current source for backlight illumination. The output current may be modulated by the duty cycle of a 1-bit digital signal. In one approach, the reference voltage of the current source may be "chopped" (e.g., the reference voltage may be applied to the input of the low-pass filter when the modulation signal is high, while otherwise the filter input may be set to zero). The effective reference voltage applied to the current source may then be a function of the duty cycle of the modulating signal and the reference voltage. This may be referred to as analog dimming. In another approach, the output current may be directly modulated. This may be referred to as digital dimming. Additional detail is given in connection with FIG. 9 below.

In some configurations, a display may provide an additional pulse-width modulation signal for dimming control that senses ambient light conditions (for content adaptive backlight control, for example). More specifically, a content adaptive backlight control (CABC) signal may be a single bit digital pulse-width modulation signal input to a white light emitting diode (WLED) module from a display that may be used to modulate white light emitting diode current sinks. The content adaptive backlight control signal may be provided by a display driver integrated circuit, which monitors ambient light conditions and display content to provide additional modulation information to the backlight light emitting diode driver.

It may be beneficial to combine content automatic backlight control with the primary dimming control for overall lighting control. For example, a first signal may provide primary dimming control, while a second signal may be a pulse-width modulation signal (e.g., a content adaptive backlight control signal as described above). It may be desirable to utilize the first signal and second signal for overall lighting control as illustrated in Equation (1) above.

Some approaches to achieve this functionality are described as follows. In one approach, the first signal (e.g., a primary modulator output) may be "ANDed" with the second signal (e.g., content automatic backlight control signal). Some disadvantages to this approach are that it may create visible "beat" frequencies and may provide non-monotonic behavior. For example, if the frequencies of the two signals are relatively close to each other, visible "beat" frequencies may occur. In other words, use of simple gating of the second signal (e.g., content automatic backlight control signal) and the first signal (e.g., primary modulation signal) will result in inferior performance.

In another approach, a digital multiplier may be used to combine the first signal (e.g., primary digital input) and the second signal (e.g., content automatic backlight control signal). A disadvantage to this approach is that the second signal (e.g., content automatic backlight control signal) may need to be converted from serial to parallel. A multiplier (e.g., a 12-bit multiplier) may then be applied. This approach may require a relatively large die area to implement and may result in high power dissipation. In other words, use of a digital multiplier may result in increased die area and current drain.

In another approach, low-pass filters may be cascaded for the second signal (e.g., content automatic backlight control signal) and the first signal (e.g., primary modulation signal). In particular, the second signal (e.g., content automatic backlight control signal) may be treated like another pulse-width modulation input. In this approach, the reference voltage may be "chopped" based on the second signal, filtered and then "chopped" again with the first signal (e.g., digital modulator input). Disadvantages to this approach include adding another large low-pass filter, cross-talk between channels (e.g., coupling or interaction through the filter for the content adaptive backlight control signal) and no digital dimming solution for content automatic backlight control. In other words, use of cascaded low-pass filters does not support digital dimming (which is a substantial part of the market), and may require an external component or large die area to implement. Potential performance issues may also arise in this approach. Accordingly, these approaches may be inferior in die area and current drain, and potentially inferior in performance.

Some configurations of the systems and methods disclosed herein include a digital modulator for lighting control that supports a content automatic backlight control input. For example, the systems and methods disclosed herein may be applied to lighting products with content adaptive lighting feedback. The digital modulator may functionally operate as a 1-bit digital multiplier. Additionally, the digital modulator may support sigma delta modulation and/or pulse width modulation modes. In some implementations, the digital modulator may use a second signal (e.g., a 1-bit content automatic backlight control input) to "hold" a state of an accumulator and then gate the output. In this approach, primary duty cycle information is not lost and no beat frequency or nonlinearity issues may occur.

For example, the digital modulator may use sigma-delta modulation for digital modulation for 12-bit resolution control. The second signal (e.g., content adaptive backlight control signal) may be used as a "hold" input for the accumulator (to stop accumulating, for instance). The sigma-delta modulator output may be gated to utilize the second signal effectively as a multiplier on a reference voltage. This avoids "beating" issues described above (when only gating the sigma-delta modulation output, for example).

The digital modulator may exhibit modulator linearity with and without application of the second signal (e.g., content adaptive backlight control signal). For example, graph A 1293*a* illustrated in FIG. 12 of a reference voltage versus a primary input code (e.g., the first signal, such as a sigma-delta modulator input code, for instance) may demonstrate an approximately linear response. Furthermore, graph B 1293*b* illustrated in FIG. 12 of differential nonlinearity (DNL) versus a primary input code (e.g., the first signal, such as a digital modulator input code, for instance) may demonstrate that a reference voltage output is monotonic for all input codes with or without application of the second signal (e.g., content adaptive backlight control signal). This could alternatively be demonstrated relative to integral nonlinearity (INL). More detail is provided below.

One example of a digital modulator in accordance with the systems and methods disclosed herein may be implemented as follows. The digital modulator may support both 12-bit sigma-delta modulation and 9-bit pulse-width modulation. The 12-bit sigma-delta modulation may be beneficially applied for analog dimming. The 9-bit pulse-width modulation may be beneficially applied for digital dimming. The digital modulator remains linear with the second signal applied (e.g., content adaptive backlight control input) in both modes.

Another example of the digital modulator may provide content adaptive backlight control support with pulse-width modulation. Using a similar "hold" technique with pulse-width modulation, content adaptive backlight control may also be supported as an additional modulation input with a pulse-width modulation modulator, similar to the sigma-delta modulation approach.

Some implementations of a digital modulator in accordance with the systems and methods described herein may provide enhancements for white light emitting diode current sinks as follows. The digital modulator may provide 12-bit current resolution control and 6.1 microamps (μA) per step (e.g., 6.1 μA/step) at a 25 milliamps (mA) full scale current sink setting. The digital modulator may also provide monotonicity (e.g., a monotonic response) for 12-bit control. In other words, the output may not have negative steps with increasing inputs. Additionally or alternatively, the differential nonlinearity (DNL) of the digital modulator may not be less than −1 least significant bit.

It should be noted that two or more of the elements described herein may be coupled together. As used herein, the term "couple" and variations thereof may mean that two or more elements may be connected directly or indirectly (e.g., through another element). For example, a first element that is coupled to a second element may be directly connected to the second element (by a wire or bus, for instance) or may be indirectly connected to the second element through a third element. In some instances, couplings may be depicted as lines or arrows in the Figures. However, it should be noted that, in some cases, not all possible couplings may be depicted for simplicity, clarity and convenience.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of circuitry 110 for performing digital modulation. The circuitry 110 may be implemented with a plurality of circuit components. For example, the circuitry 110 may include one or more resistors, capacitors, inductors, transistors, logic gates, registers, memory cells, processing blocks and/or switches, etc. For instance, the circuitry 110 may be implemented as an integrated circuit, an application-specific integrated circuit (ASIC), field-programmable gate array (FPGA), etc.

The circuitry 110 includes a digital modulator 102. The digital modulator 102 receives a first signal 104. The first signal 104 may have a first duty cycle. For example, the first signal 104 may be a pulse-width modulation signal with a first duty cycle. A duty cycle may be expressed as the percentage of a time period that a signal has a certain state or value. For instance, a 1-bit pulse-width modulation signal that has a value of 1 for 80% of a time period (and a value of 0 for 20% of the time period, for example) may have a duty cycle of 80%.

The digital modulator 102 also receives a second signal 106. The second signal 106 may have a second duty cycle. For example, the second signal 106 may be an additional pulse-width modulation signal (e.g., single-bit pulse-width modulation signal). In some configurations, the digital modulator 102 may utilize the second signal 106 as a hold signal. It should be noted that the first signal 104 and the second signal 106 may have same or differing input frequencies. In some configurations, the second signal 106 may be received from an external source. For instance, the second signal 106 may be provided by a display driver integrated circuit that is external to the digital modulator 102 and/or the circuitry 110. It should be noted that the digital modulator 102 may not be a conventional parallel multiplier, for example.

The digital modulator 102 produces a monotonic multiplied modulated signal 108. For example, a property (e.g., a third duty cycle) of the monotonic multiplied modulated signal 108 may indicate a (e.g., may be the) multiplication or product of the first duty cycle (of the first signal 104) and the second duty cycle (of the second signal 106). Assume, for example, a first duty cycle of 80% and a second duty cycle of 50%. In this example, the third duty cycle of the monotonic multiplied modulated signal 108 may be 40%. Accordingly, the digital modulator 102 may provide a 1-bit multiplication functionality in some configurations. It should be noted that the accuracy of the modulated signal is only be limited by the accuracy of the internal modulator (e.g., bit width) and the accuracy of the second signal (e.g., content adaptive backlight control signal). There are no inherent accuracy limits due to the architecture creating the composite output itself.

Additionally, the digital modulator 102 may exhibit a monotonic response based on the first signal 104 and the second signal 106 in producing the monotonic multiplied modulated signal 108. In particular, the monotonic multiplied modulated signal 108 may only exhibit an increasing property relative to an increase in the duty cycle of the first signal 104 or the second signal 106. For instance, a duty cycle of the monotonic multiplied modulated signal 108 may increase based on an increase in the duty cycle of the first signal 104 (assuming no decrease in the second signal 106) or based on an increase in the duty cycle of the second signal 106 (assuming no decrease in the first signal 104).

In some configurations, the digital modulator 102 may exhibit a linear response based on the first signal 104 and the second signal 106. For example, the input-output response of the digital modulator 102 may be linear. In other words, a property (e.g., duty cycle) of the monotonic multiplied modulated signal 108 may increase or decrease in a linear fashion with concomitant increases and/or decreases in the first duty cycle of the first signal 104 and in the second duty cycle of the second signal 106.

In some configurations, the monotonic multiplied modulated signal 108 may be a pulse-width modulated signal. Alternatively, the monotonic multiplied modulated signal 108 may be a sigma-delta modulated signal. The digital modulator 102 may provide the monotonic multiplied modulated signal 108 to a dimmer in some configurations. The dimmer may perform analog dimming and/or digital dimming based on the monotonic multiplied modulated signal 108.

Figure 2:
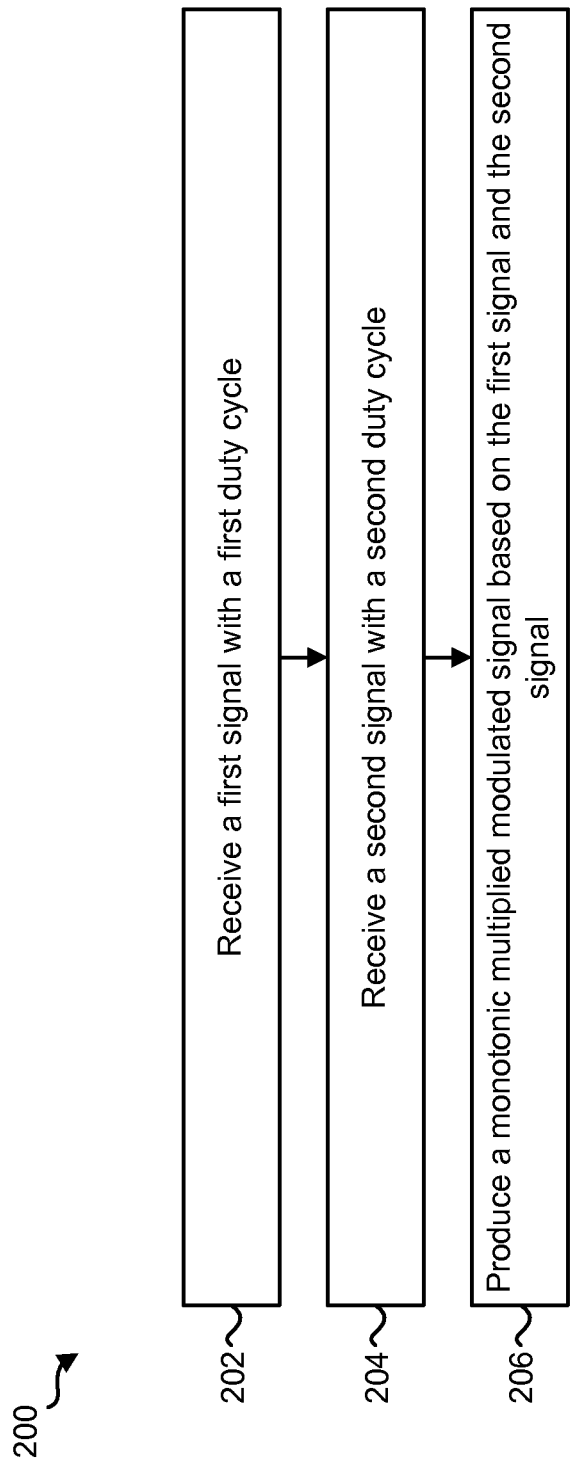
FIG. 2 is a flow diagram illustrating one configuration of a method for performing digital modulation.

FIG. 2 is a flow diagram illustrating one configuration of a method 200 for performing digital modulation. A digital modulator 102 may receive 202 a first signal 104 with a first duty cycle. For example, the first signal 104 may be a 1-bit pulse-width modulation signal. In some configurations, the first signal 104 may be an internal signal received 202 from internal circuitry. For instance, the first signal 104 may be received 202 from registers for dimming control that may also be included in the circuitry 110. In one implementation, the first signal 104 may be provided from a 12-bit register sent via a serial interface.

The digital modulator 102 may receive 204 a second signal 106 with a second duty cycle. For example, the second signal 106 may be a single-bit modulation signal. More specifically, the second signal 106 may be an additional 1-bit pulse-width modulation signal. In some configurations, the second signal 106 may be an external signal received 204 from an external source. For instance, the second signal 106 may be provided by a display driver integrated circuit that is external to the digital modulator 102 and/or the circuitry 110. In some configurations, the digital modulator 102 may utilize the second signal 106 as a hold signal. It should be noted that the first signal 104 and the second signal 106 may have same or differing input frequencies.

The digital modulator 102 may produce 206 a monotonic multiplied modulated signal 108 based on the first signal 104 and the second signal 106. For example, a property (e.g., a third duty cycle) of the monotonic multiplied modulated signal 108 may indicate a multiplication or product of the first duty cycle (of the first signal 104) and the second duty cycle (of the second signal 106). In some configurations, for instance, the digital modulator 102 may produce 206 the monotonic multiplied modulated signal 108 based on the first signal 104 and the second signal 106 by utilizing the second signal 106 as a hold signal, where a third duty cycle of the monotonic multiplied modulated signal 108 is a product of the first duty cycle and the second duty cycle. For example, the second signal 106 may be utilized to control a hold state of an accumulator or to control one or more counters. More detail is given below.

Additionally, the digital modulator 102 may exhibit a monotonic response based on the first signal 104 and the second signal 106 in producing 206 the monotonic multiplied modulated signal 108. In particular, the monotonic multiplied modulated signal 108 may only exhibit an increasing property relative to an increase in the duty cycle of the first signal 104 or the second signal 106 as described above, for example. In some configurations, the digital modulator 102 may exhibit a linear response based on the first signal 104 and the second signal 106 as described above, for example. Additionally or alternatively, the monotonic multiplied modulated signal 108 may be a pulse-width modulated signal (e.g., a monotonic multiplied pulse-width modulated signal) or a sigma-delta modulated signal (e.g., a monotonic multiplied sigma-delta modulated signal).

Figure 3:
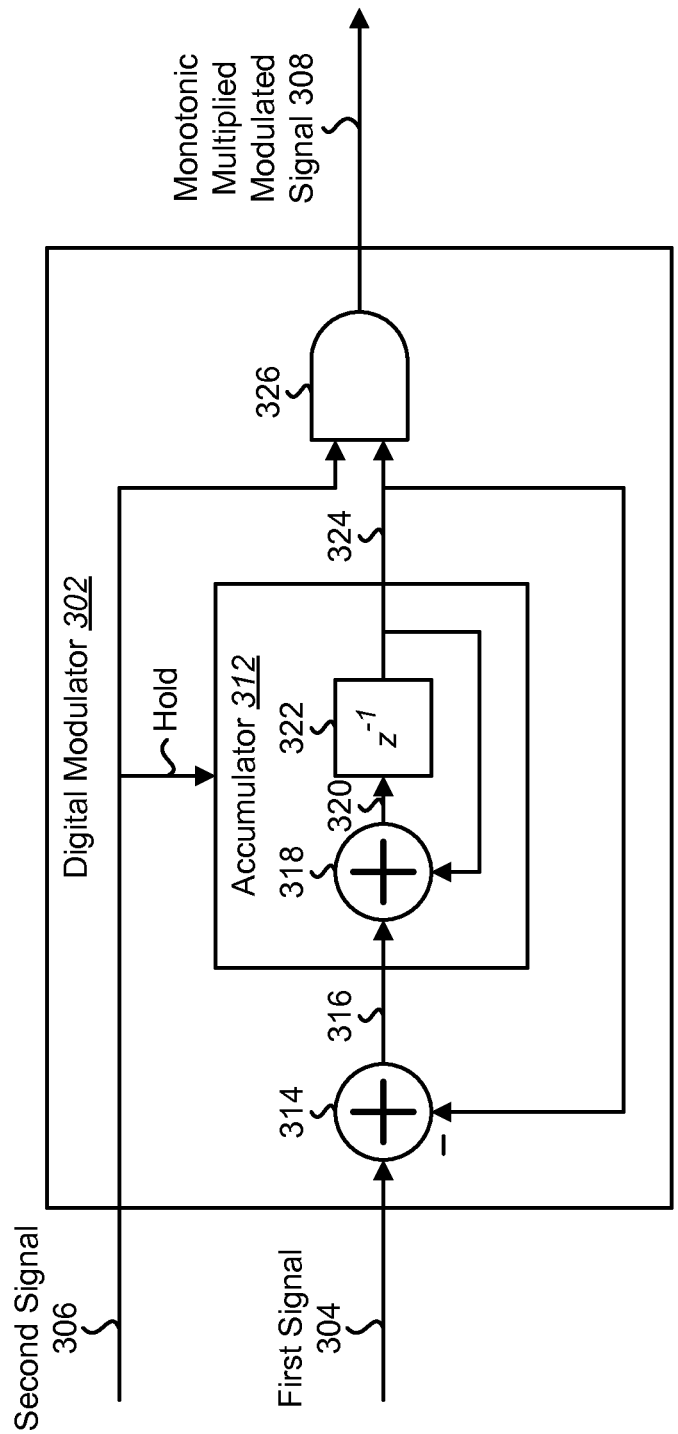
FIG. 3 is a block diagram illustrating a more specific configuration of a digital modulator in accordance with the systems and methods disclosed herein.

FIG. 3 is a block diagram illustrating a more specific configuration of a digital modulator 302 in accordance with the systems and methods disclosed herein. The digital modulator 302 illustrated in FIG. 3 may be one example of the digital modulator 102 described in connection with FIG. 1. For example, the digital modulator 302 may functionally operate as a 1-bit digital multiplier. The digital modulator 302 includes a first adder 314, an accumulator 312 and an AND gate 326. The digital modulator 302 illustrated in FIG. 3 supports a sigma-delta modulation mode. In some approaches, the digital modulator 302 illustrated in FIG. 3 could be modified by adding a second counter and controls to provide pulse-width modulation functionality. However, FIG. 3 provides a simplified diagram that illustrates operation in a sigma-delta modulation mode with a second signal 306 (e.g., an external pulse-width modulation signal).

The digital modulator 302 may receive a first signal 304. As described above, the first signal 304 may be a pulse-width modulation signal. The first signal 304 may be provided to the first adder 314, which subtracts an accumulator output 324 from the first signal 304 (e.g., which adds the first signal 304 to a negative version of the accumulator output 324). The first adder output 316 (e.g., the difference of the first signal 304 and the accumulator output 324) may be provided to the accumulator 312.

The accumulator 312 may provide an accumulator output 324 based on the first signal 304 and the second signal 306. The accumulator 312 may include a second adder 318 and a delay 322. The first adder output 316 may be provided to the second adder 318, which adds the first adder output 316 to the accumulator output 324 (e.g., the delay output). The second adder output 320 may be provided to the delay 322. The delay 322 may delay the second adder output 320 (by one sample, for example). Accordingly, the accumulator 312 may add an input value (e.g., the first adder output 316) to a present value (e.g., the accumulator output 324) and store the resulting value (e.g., the sum of the input value and present value). The accumulator output 324 (e.g., the delay output) may be provided to the AND gate 326.

The digital modulator 302 (e.g., the accumulator 312) may utilize the second signal 306 as a hold signal. For example, the accumulator 312 may receive the second signal 306, which may be used to control a hold state of the accumulator 312. For instance, the accumulation function provided by the accumulator 312 may be stopped and started based on the second signal 306. In some configurations, the accumulator 312 may be placed in a hold state when the second signal 306 is low. For instance, the second signal 306 may be a 1-bit pulse-width modulation signal that may place the accumulator 312 in a hold state when its value is 0. Utilizing the second signal 306 as a hold signal (or clock enable signal, for example) on the accumulator 312 may preserve the duty cycle information from the first signal 304. In contrast, typical sigma-delta modulators do not have a hold state dependent on another input.

The second signal 306 may also be provided to the AND gate 326. The AND gate 326 may produce the monotonic multiplied modulated signal 308 based on the accumulator output 324 and the second signal 306. In some configurations, the monotonic multiplied modulated signal 308 may be provided to a dimmer. For example, the dimmer may perform analog and/or digital dimming based on the monotonic multiplied modulated signal 308.

Figure 4:
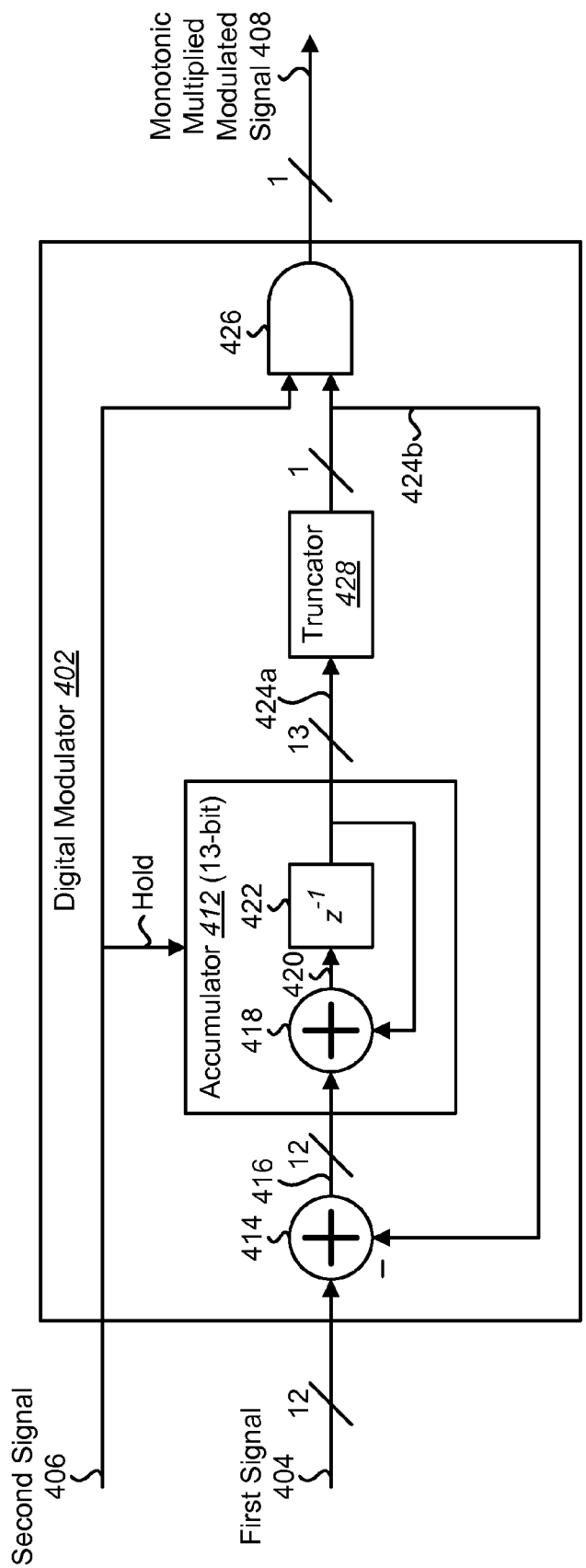
FIG. 4 is a block diagram illustrating another more specific configuration of a digital modulator in accordance with the systems and methods disclosed herein.

FIG. 4 is a block diagram illustrating another more specific configuration of a digital modulator 402 in accordance with the systems and methods disclosed herein. The digital modulator 402 illustrated in FIG. 4 may be one example of the digital modulator 102 described in connection with FIG. 1 and/or may be one example of the digital modulator 302 described in connection with FIG. 3. For example, the digital modulator 402 may functionally operate as a 1-bit digital multiplier. The digital modulator 402 includes a first adder 414, an accumulator 412, a truncator 428 and an AND gate 426. The digital modulator 402 illustrated in FIG. 4 supports a sigma-delta modulation mode.

The digital modulator 402 may receive a first signal 404. As described above, the first signal 404 may be a pulse-width modulation signal. In the configuration illustrated in FIG. 4, the first signal 404 is a 12-bit pulse-width modulation signal. The first signal 404 may be provided to the first adder 414, which subtracts a truncated accumulator output 424b from the first signal 404. For example, the truncated accumulator output 424b causes the first adder 414 to subtract a full scale 12-bit value when high and to subtract zero when low. The first adder output 416 (e.g., the difference of the first signal 404 and the truncated accumulator output 424b) may be a 12-bit signal that is provided to the accumulator 412.

In the configuration illustrated in FIG. 4, the accumulator 412 is a 13-bit accumulator. The accumulator 412 may include a second adder 418 and a delay 422. The first adder output 416 may be provided to the second adder 418, which adds the first adder output 416 to the accumulator output 424a (e.g., the delay output). The second adder output 420 may be provided to the delay 422. The delay 422 may delay the second adder output 420 by one sample. Accordingly, the accumulator 412 may add an input value (e.g., the first adder output 416) to a present value (e.g., the accumulator output 424a) and store the resulting value (e.g., the sum of the input value and present value). The accumulator output 424a (e.g., the delay output) may be a 13-bit signal that is provided to the truncator 428.

The truncator 428 may truncate the 13-bit accumulator output 424a to produce a 1-bit truncated accumulator output 424b. For example, the truncator 428 may take the most significant bit (MSB) from the 13-bit accumulator output 424a. Accordingly, the 1-bit truncated accumulator output 424b may be the most significant bit of the 13-bit accumulator output 424a. The truncated accumulator output 424b may be provided to the AND gate 426.

The digital modulator 402 may utilize the second signal 406 as a hold signal. For example, the accumulator 412 may receive the second signal 406, which may be used to control a hold state of the accumulator 412. For instance, the accumulation function provided by the accumulator 412 may be stopped and started based on the second signal 406. In some configurations, the accumulator 412 may be placed in a hold state when the second signal 406 is low. For instance, the second signal 406 may be a 1-bit pulse-width modulation signal that may place the accumulator 412 in a hold state when its value is 0. Utilizing the second signal 406 as a hold signal (or clock enable signal, for example) on the accumulator 412 may preserve the duty cycle information from the first signal 404.

The second signal 406 may also be provided to the AND gate 426. The AND gate 426 may produce the monotonic multiplied modulated signal 408 based on the truncated accumulator output 424b and the second signal 406. In the configuration illustrated in FIG. 4, the monotonic multiplied modulated signal 408 is a 1-bit signal. In some configurations, the monotonic multiplied modulated signal 408 may be provided to a dimmer. For example, the dimmer may perform analog and/or digital dimming based on the monotonic multiplied modulated signal 408.

Figure 5:
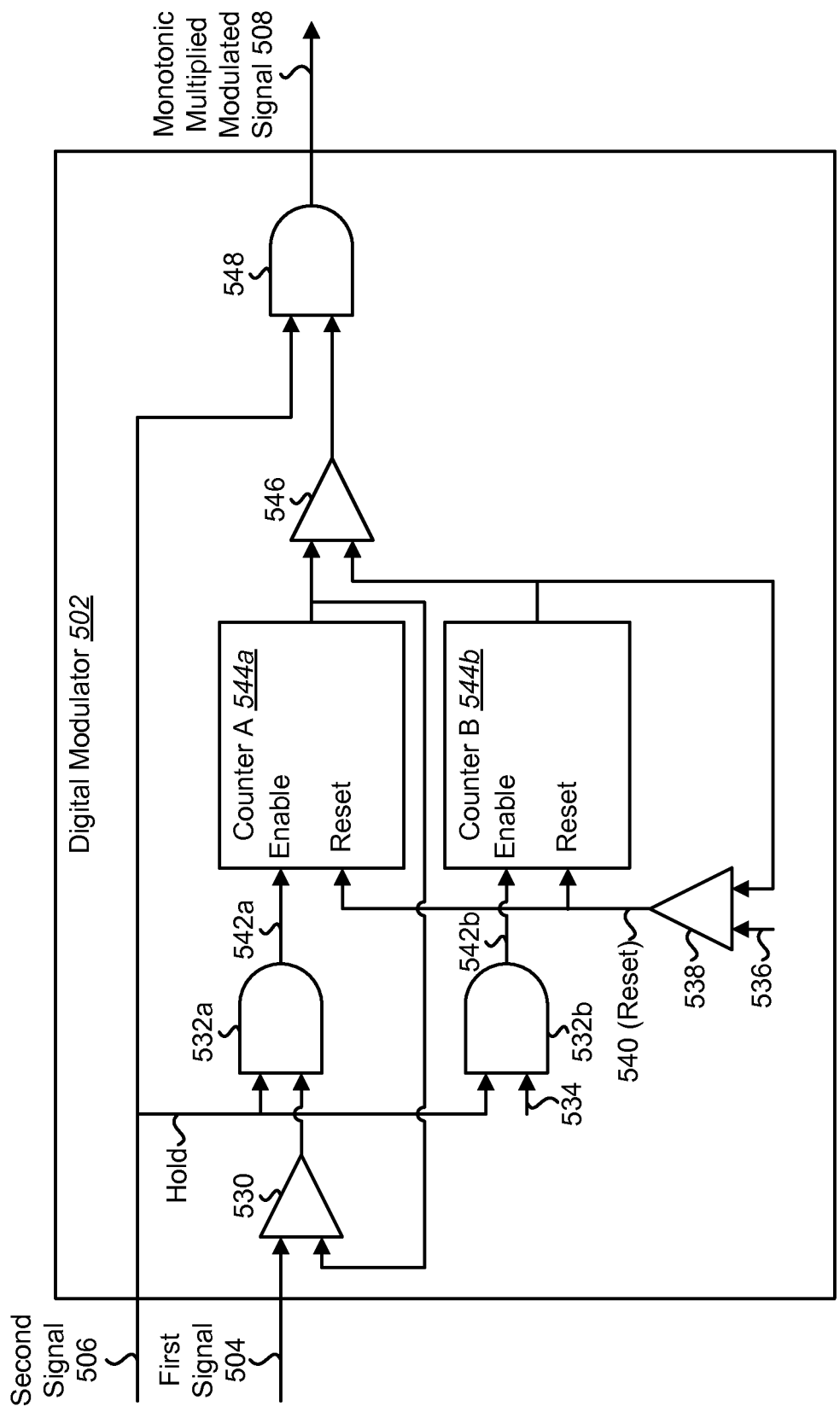
FIG. 5 is a block diagram illustrating another more specific configuration of a digital modulator in accordance with the systems and methods disclosed herein.

FIG. 5 is a block diagram illustrating another more specific configuration of a digital modulator 502 in accordance with the systems and methods disclosed herein. The digital modulator 502 illustrated in FIG. 5 may be one example of the digital modulator 102 described in connection with FIG. 1. The digital modulator 502 includes a first comparator 530, a second comparator 538, a third comparator 546, a first AND gate 532a, a second AND gate 532b, a third AND gate 548, counter A 544a and counter B 544b.

The digital modulator 502 may receive a first signal 504. As described above, the first signal 504 may be a pulse-width modulation signal. For example, the first signal 504 may be a 9-bit pulse-width modulation signal. The first signal 504 may be provided to the first comparator 530, which compares the first signal 504 to a counter A 544a output. The first comparator 530 output may be high if the first signal 504 is greater than the counter A 544a output. The first comparator 530 output may be provided to the first AND gate 532a.

The digital modulator 502 may utilize the second signal 506 as a hold signal. For example, the second signal 506 may be supported as an additional modulation input with a pulse-width modulator, similar to a sigma-delta modulation approach described herein. The second signal 506 may be provided to the first AND gate 532a and to the second AND gate 532b. The first AND gate 532a may produce a first (count) enable signal 542a based on the first comparator 530 output and the second signal 506 (e.g., the hold signal). The first enable signal 542a may be provided to counter A 544a. The second AND gate 532b may produce a second (count) enable signal 542b based on a pulse-width modulation enable signal 534 and the second signal 506 (e.g., the hold signal). The second enable signal 542b may be provided to counter B 544b.

Counter A 544a may maintain a first count. For example, counter A 544a may count a number of time periods (e.g., samples) while indicated by the first enable signal 542a. Counter A 544a counts from zero to the input 504 when enabled. The counter A 544a output may indicate the first count. Counter B 544b may maintain a second count. For example, counter B 544b may count a number of time periods (e.g., samples) while indicated by the second enable signal 542b. Counter B 544b counts from zero to full scale (511 decimal in this example) when enabled. The counter B 544b output may indicate the second count. The counter B 544b output may be provided to the second comparator 538 and to the third comparator 546.

The second comparator 538 may provide a reset signal 540 to counter A 544a and to counter B 544b. The second comparator 538 may produce the reset signal 540 based on whether the value of the counter B 544b output is equal to a threshold value 536. In some configurations, for example, the counter B 544b output may be a 9-bit signal and the threshold value 536 may be 511 (e.g., $2^9-1$). Accordingly, when the counter B 544b output has reached its maximum value, the reset signal 540 may cause counter A 544a and counter B 544b to reset.

The counter A 544a output and the counter B 544b output may be provided to the third comparator 546. The third comparator 546 may determine whether the value of the counter A 544a output and the value of the counter B 544b output are equal. For example, if the value of the counter A 544a output is less than or equal to the value of the counter B 544b output, then the third comparator 546 output may have a bit value of '1.'

The second signal 506 and the third comparator 546 output may be provided to the third AND gate 548. The third AND gate 548 may produce the monotonic multiplied modulated signal 508 based on the second signal 506 and the third comparator 546 output. In one example, the monotonic multiplied modulated signal 508 is a 1-bit signal. In some configurations, the monotonic multiplied modulated signal 508 may be provided to a dimmer. For example, the dimmer may perform analog and/or digital dimming based on the monotonic multiplied modulated signal 508.

Listing (1) below provides Verilog code of one example of a digital modulator in accordance with the systems and methods disclosed herein.

Listing (1)

```
module wled_dig_sdm_pwm ( dout, clk, enable, din, cabc, doutb, resetb, pwm_mode );
input wire clk;
output wire dout;
input wire enable;
input wire [11:0] din;
input wire cabc;
output wire doutb;
input wire resetb;
input wire pwm_mode;
reg [12:0] delay;
wire dout_sdm = delay[12];
always @(posedge clk or negedge resetb) begin
    if (!resetb) delay <= 13'd0;
    else if (enable) begin
        if (pwm_mode) delay <= cabc ? ((delay == 13'd511) ? 13'd0 : (delay + 1)) : delay;
        else delay <= cabc ? ({1'b0,din} + delay - {1'b0, {12{dout_sdm}}}) : delay;
    end
end
assign dout = pwm_mode ? (cabc ? (({{3{1'b0}},din[11:3]} >= delay) ? 1'b1 : 1'b0) : 1'b0) : (cabc & dout_sdm);
assign doutb = !dout;
endmodule
```

Figure 6:
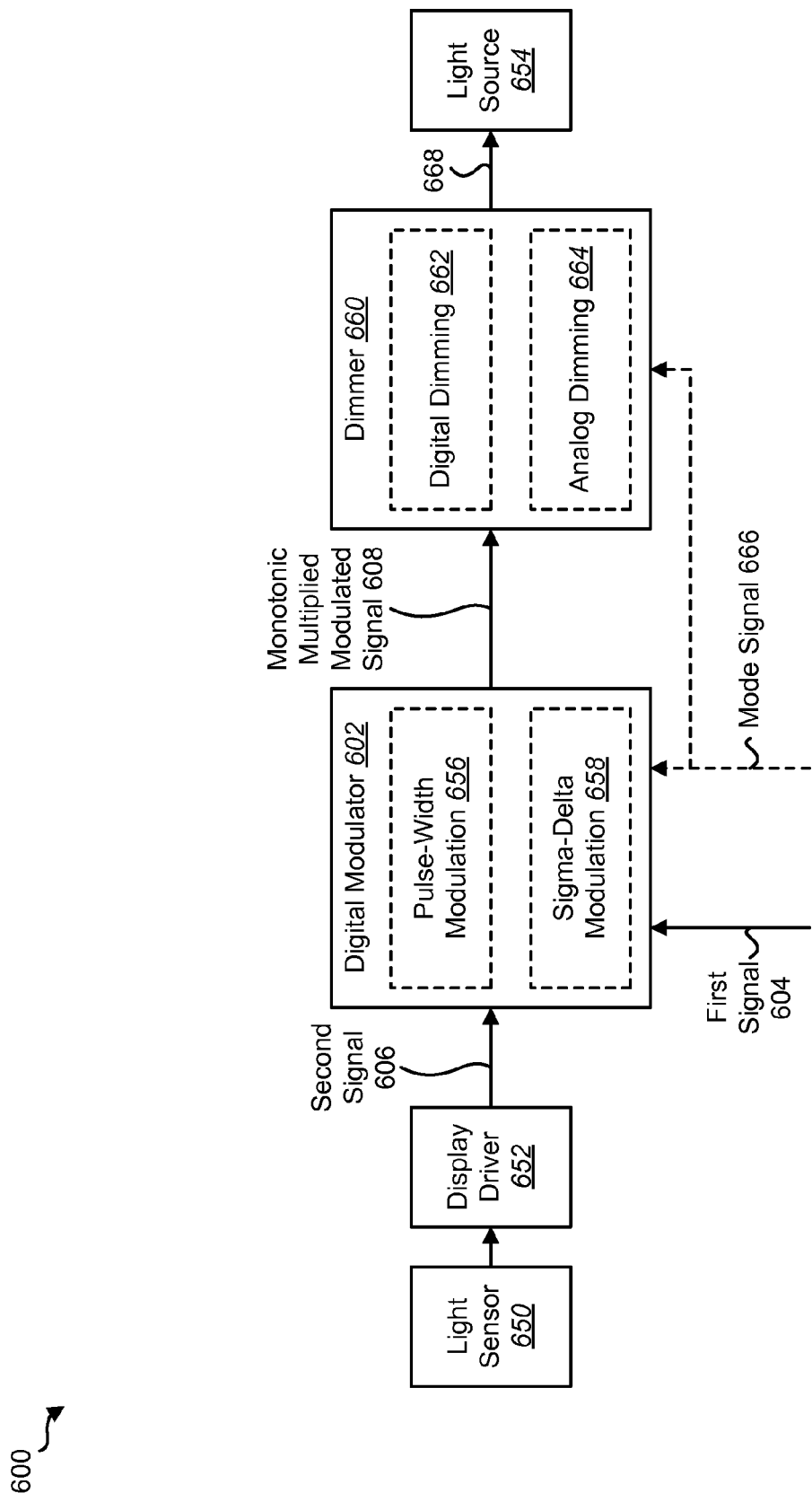
FIG. 6 is a block diagram illustrating one configuration of an electronic device in which systems and methods for performing digital modulation may be implemented.

FIG. 6 is a block diagram illustrating one configuration of an electronic device 600 in which systems and methods for performing digital modulation may be implemented. Examples of the electronic device 600 include smartphones, laptop computers, tablet devices, televisions, etc. The electronic device 600 may include a light sensor 650, a display driver 652, a light source 654, a digital modulator 602 and/or a dimmer 660. In some configurations, the light sensor 650, display driver 652 and/or the light source 654 may be integrated into a unit. The light sensor 650 may be coupled to the display driver 652, which may be coupled to the digital modulator 602, which may be coupled to the dimmer 660, which may be coupled to the light source 654. As used herein, the term "couple" and variations thereof may denote a direct or an indirect connection. For example, if a first element is coupled to a second element, then the first element may be connected directly to the second element or may be connected to the second element through one or more other elements.

The light sensor 650 detects ambient light. For example, the light sensor 650 may detect a brightness and/or intensity of ambient light. The light sensor 650 may indicate the brightness and/or intensity of ambient light to the display driver 652.

The display driver 652 may control the light source 654 by providing a second signal 606 to the digital modulator 602. For example, the light source 654 may be a backlight for a display panel. For instance, the light source 654 may be one or more strings of light emitting diodes that provide a backlight for a liquid crystal display.

The digital modulator 602 may be an example of one or more of the digital modulators 102, 302, 402, 502, 802 described herein. For example, the digital modulator 602 may produce the monotonic multiplied modulated signal 608 based on a first signal 604 (e.g., an internal pulse-width modulation signal that may be used to control the light source 654 brightness) and the second signal 606 (e.g., an external pulse-width modulation signal that may also be used to control the light source 654 brightness).

The digital modulator 602 may provide one or more of pulse-width modulation 656 and sigma-delta modulation 658. For example, the digital modulator 602 may produce a monotonic multiplied modulated signal 608 based on pulse-width modulation 656 and/or sigma-delta modulation 658. In some configurations and/or instances, the monotonic multiplied modulated signal 608 may be a pulse-width modulated signal. In other configurations and/or instances, the monotonic multiplied modulated signal 608 may be a sigma-delta modulated signal. For instance, the digital modulator 602 may be capable of performing both pulse-width modulation 656 and sigma-delta modulation 658 in some implementations. Optionally, a mode signal 666 may control whether the digital modulator 602 performs pulse-width modulation 656 or sigma-delta modulation 658.

The monotonic multiplied modulated signal 608 may be provided to the dimmer 660. The dimmer 660 may be circuitry that controls the light source 654. For example, the dimmer 660 may control an electronic signal 668 (e.g., a current) that powers the light source 654. The dimmer 660 may perform one or more of digital dimming 662 and analog dimming 664. In some configurations, the dimmer 660 may include a current source that controls a bias current (e.g., the electronic signal 668) that controls the brightness of the light source 654. Digital dimming 662 may involve directly modulating the bias current (e.g., the electronic signal 668) of the current source. Analog dimming 664 may involve switching or "chopping" a reference voltage of the current source. In some configurations, the dimmer 660 may be capable of performing both digital dimming 662 and analog dimming 664. In this case, the mode signal 666 may control the type of dimming performed by the dimmer 660. For example, sigma-delta modulation 658 may typically provide better light source 654 performance in combination with analog dimming 664. Alternatively, pulse-width modulation 656 may typically provide better light source 654 performance in combination with digital dimming 662.

The electronic signal 668 (e.g., bias current) may be provided to the light source 654. The brightness of the light source 654 may depend on the duty cycle of the first signal 604 and the duty cycle of the second signal 606. For example, the digital modulator 602 and the dimmer 660 may approximate the operation illustrated in Equation (1) above, where $I_{LED}$ is the electronic signal 668 current, $I_{CS}$ is the full-scale current provided by the current source included in the dimmer 660, $D_A$ is the duty cycle of the first signal 604 and $D_B$ is the duty cycle of the second signal 606.

Figure 7:
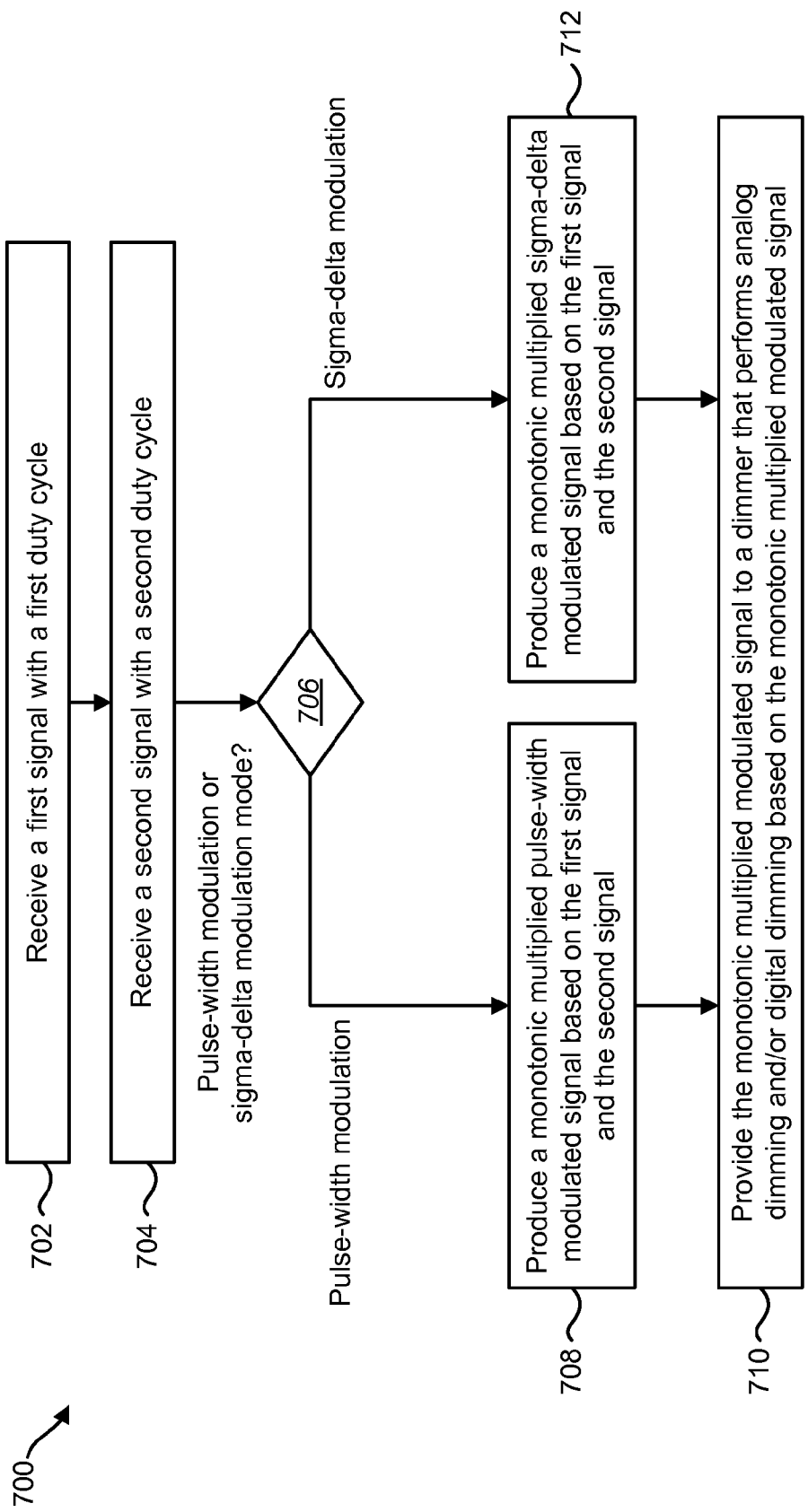
FIG. 7 is a flow diagram illustrating a more specific configuration of a method for performing digital modulation.

FIG. 7 is a flow diagram illustrating a more specific configuration of a method 700 for performing digital modulation. A digital modulator 602 may receive 702 a first signal 604 with a first duty cycle. This may be done as described above in connection with FIG. 2. The digital modulator 602 may receive 704 a second signal 606 with a second duty cycle. This may be done as described above in connection with FIG. 2.

The digital modulator 602 may determine 706 whether to operate in pulse-width modulation mode or sigma-delta modulation mode. For example, the digital modulator 602 may receive a mode signal 666 that indicates whether to operate in pulse-width modulation mode or sigma-delta modulation mode.

If the digital modulator 602 determines 706 to operate in pulse-width modulation mode, then the digital modulator 602 may produce 708 a monotonic multiplied pulse-width modulated signal 608 based on the first signal 604 and the second signal 606. However, if the digital modulator 602 determines 706 to operate in sigma-delta modulation mode, then the digital modulator 602 may produce 712 a monotonic multiplied sigma-delta modulated signal 608 based on the first signal 604 and the second signal 606.

In either case, the digital modulator 602 may provide 710 the monotonic multiplied (pulse-width or sigma-delta) modulated signal 608 to a dimmer 660 that performs analog dimming 664 and/or digital dimming 662 based on the monotonic multiplied modulated signal 608. For example, the mode signal 666 may control the type of dimming performed by the dimmer 660. For example, sigma-delta modulation 658 may typically provide better light source 654 performance in combination with analog dimming 664. Alternatively, pulse-width modulation 656 may typically provide better light source 654 performance in combination with digital dimming 662. However, it should be noted that any combination of pulse-width modulation 656, sigma-delta modulation 658, analog dimming 664 and digital dimming 662 may be performed in accordance with the systems and methods disclosed herein.

Figure 8:
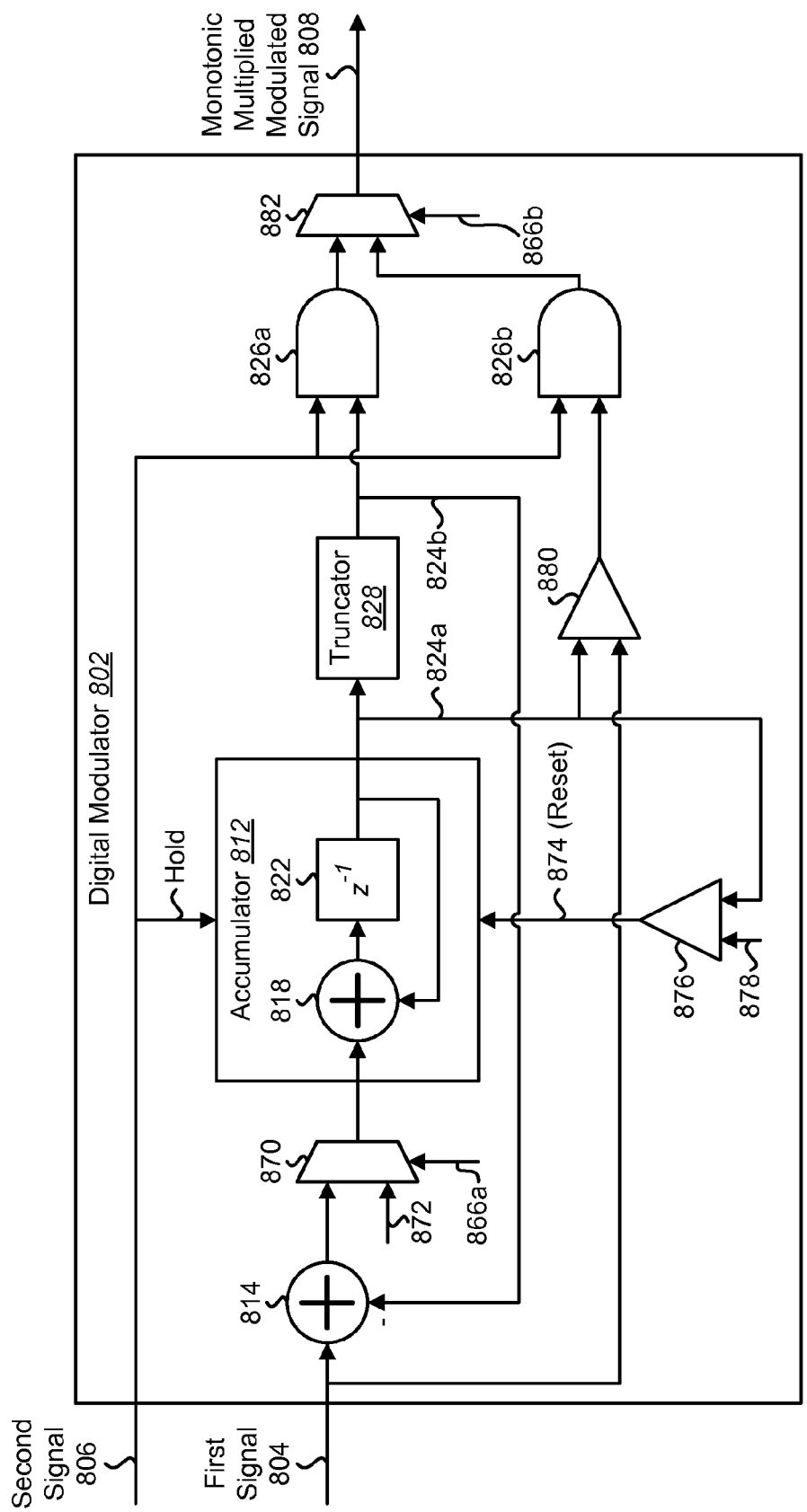
FIG. 8 is a block diagram illustrating another more specific configuration of a digital modulator in accordance with the systems and methods disclosed herein.

FIG. 8 is a block diagram illustrating another more specific configuration of a digital modulator 802 in accordance with the systems and methods disclosed herein. The digital modulator 802 illustrated in FIG. 8 may be one example of one or more of the digital modulators 102, 302, 402 described in connection with FIG. 1, FIG. 3 and/or FIG. 4. For example, the digital modulator 802 may functionally operate as a 1-bit digital multiplier. The digital modulator 802 includes a first adder 814, an accumulator 812, a truncator 828, a first AND gate 826a, a second AND gate 826b, a first multiplexer 870, a second multiplexer 882, a first comparator 876 and a second comparator 880. The digital modulator 802 may support a sigma-delta modulation mode and/or a pulse-width modulation mode. For instance, the digital modulator 802 illustrated in FIG. 8 is capable of both sigma-delta modulation functionality and pulse-width modulation functionality (e.g., the accumulators 812 may be placed in a hold state based on a content adaptive backlight control signal 806 and AND it with the outputs).

The digital modulator 802 may receive a first signal 804. As described above, the first signal 804 may be an input indicating a desired internal duty cycle. The first signal 804 may be provided to the second comparator 880. Additionally, the first signal 804 may be provided to the first adder 814, which subtracts a truncated accumulator output 824b from the first signal 804. The first adder 814 output may be a 12-bit signal in some configurations. The first adder 814 output may be provided to the first multiplexer 870. The first multiplexer 870 selects whether the accumulator 812 receives the first adder 814 output (in a sigma-delta modulation mode, for example) or another input 872 based on a mode signal 866a. The digital modulator 802 may operate in a sigma-delta modulation mode or a pulse-width modulation mode based on the mode signal 866a-b. For example, the mode signal 866a-b determines whether the digital modulator 802 operates in a sigma-delta modulation mode or a pulse-width modulation mode. In the pulse-width modulation mode, the other input 872 provides a least significant bit (LSB) (e.g., 12'b000 0000 0001) to the accumulator 812. The first multiplexer 870 output may be provided to the accumulator 812.

The accumulator 812 may include a second adder 818 and a delay 822. In some configurations, the accumulator 812 is a 13-bit accumulator. The first multiplexer 870 output may be provided to the second adder 818, which adds the first multiplexer output to the accumulator output 824a (e.g., the delay output). The second adder 818 output may be provided to the delay 822. The delay 822 may delay the second adder 818 output by one sample. Accordingly, the accumulator 812 may add an input value (e.g., the first multiplexer 870 output) to a present value (e.g., the accumulator output 824*a*) and store the resulting value (e.g., the sum of the input value and present value). The accumulator output 824*a* (e.g., the delay output) may be a 13-bit signal in some configurations. The accumulator output 824*a* may be provided to the truncator 828 and to the first comparator 876.

The first comparator 876 may produce a reset signal 874 based on whether the value of the accumulator output 824*a* is equal to a threshold value 878. In some configurations, for example, the accumulator output 824*a* may be a 9-bit signal and the threshold value 878 may be 511 (e.g., $2^9-1$). Accordingly, when the accumulator output 824*a* has reached its maximum value, the reset signal 874 may cause the accumulator 812 to reset.

The truncator 828 may truncate the accumulator output 824*a* (e.g., a 13-bit accumulator output 824*a*) to produce a 1-bit truncated accumulator output 824*b* (e.g., a 1-bit truncated accumulator output 824*b*). For example, the truncator 828 may take the most significant bit (MSB) from the accumulator output 824*a*. Accordingly, the truncated accumulator output 824*b* may be the most significant bit of the accumulator output 824*a*. The truncated accumulator output 824*b* may be provided to the first AND gate 826*a*.

The digital modulator 802 may utilize the second signal 806 as a hold signal. For example, the accumulator 812 may receive the second signal 806, which may be used to control a hold state of the accumulator 812. For instance, the accumulation function provided by the accumulator 812 may be stopped and started based on the second signal 806. In some configurations, the accumulator 812 may be placed in a hold state when the second signal 806 is low. For instance, the second signal 806 may be a 1-bit pulse-width modulation signal that may place the accumulator 812 in a hold state when its value is 0. Utilizing the second signal 806 as a hold signal (or clock enable signal, for example) on the accumulator 812 may preserve the duty cycle information from the first signal 804.

The second signal 806 may be provided to the first AND gate 826*a* and to the second AND gate 826*b*. The first AND gate 826*a* may produce a sigma-delta modulated version of the monotonic multiplied modulated signal 808 based on the truncated accumulator output 824*b* and the second signal 806. For example, the first AND gate 826*a* output may be a monotonic multiplied sigma-delta modulated signal. The first AND gate 826*a* output may be provided to the second multiplexer 882.

The second comparator 880 may compare the accumulator output 824*a* to the first signal 804. For example, the second comparator 880 may determine whether the first signal 804 is greater than or equal to the accumulator output 824*a*. The second comparator 880 output may be provided to the second AND gate 826*b*. The second AND gate 826*b* may produce a pulse-width modulated version of the monotonic multiplied modulated signal 808 based on the second comparator 880 output and the second signal 806. For example, the second AND gate 826*b* output may be a monotonic multiplied pulse-width modulated signal. The second AND gate 826*b* output may be provided to the second multiplexer 882.

The second multiplexer 882 may select the first AND gate 826*a* output or the second AND gate 826*b* output based on a mode signal 866*b*. For example, the second multiplexer 882 may provide a monotonic multiplied sigma-delta modulated signal 808 from the first AND gate 826*a* if the mode signal 866*b* indicates a sigma-delta modulation mode. Alternatively, the second multiplexer 882 may provide a monotonic multiplied pulse-width modulated signal 808 from the second AND gate 826*b* if the mode signal 866*b* indicates a pulse-width modulation mode.

In some configurations, the monotonic multiplied modulated signal 808 is a 1-bit signal. The monotonic multiplied modulated signal 808 may be provided to a dimmer in some implementations. For example, the dimmer may perform analog and/or digital dimming based on the monotonic multiplied modulated signal 808.

Figure 9:
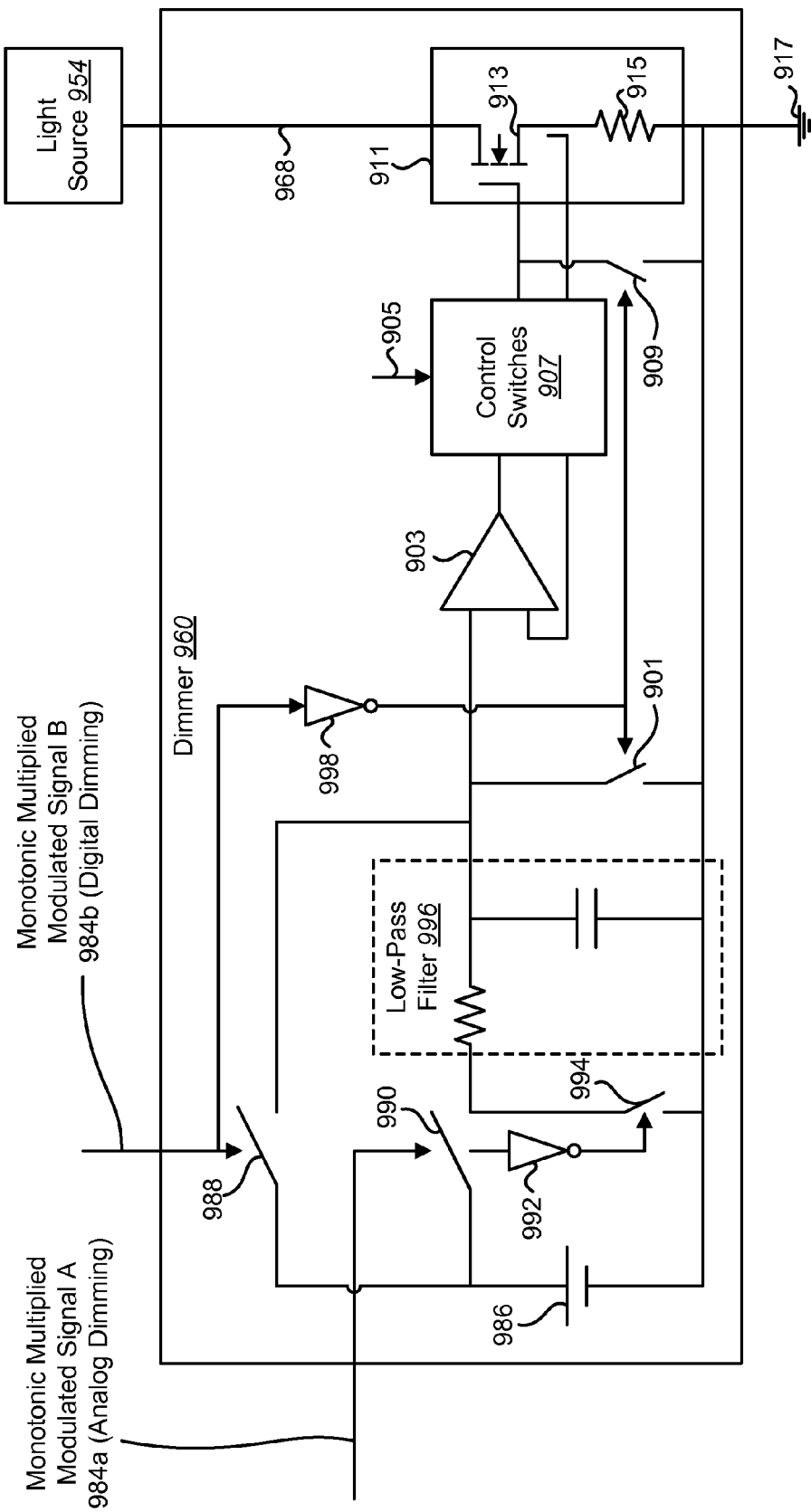
FIG. 9 is a block diagram illustrating one configuration of a dimmer.

FIG. 9 is a block diagram illustrating one configuration of a dimmer 960. The dimmer 960 may be coupled to a digital modulator (e.g., digital modulator 102, 302, 402, 502, 602, 802, etc.) in order to control the brightness of a light source 954. The dimmer 960 may include a reference voltage 986, a first switch 988, a second switch 990, a third switch 994, a fourth switch 901, a fifth switch 909, a first inverter 992, a second inverter 998, a low-pass filter 996, an amplifier 903, control switches 907 and/or one or more current sources 911.

When in an analog dimming mode, the monotonic multiplied modulated signal A 984*a* may control the second switch 990 and the third switch 994 to "chop" the reference voltage 986 of the current source 911. For example, the reference voltage 986 may be applied to the input of the low-pass filter 996 when monotonic multiplied modulated signal A 984*a* is high, while otherwise the filter 996 input may be set to zero. The effective reference voltage applied to the current source 911 may then be a function of the duty cycle of monotonic multiplied modulated signal A 984*a* and the reference voltage 986. For instance, the second switch 990, the third switch 994 and the inverter 992 may serve to couple and decouple the reference voltage 986 to and from the low-pass filter 996. The low-pass filter 996 may include a resistor and a capacitor. The low-pass filter 996 may filter the switched or "chopped" reference voltage signal. The filtered signal may be provided to the amplifier 903, which amplifies the filtered signal and provides the amplified, filtered signal to the control switches 907 and/or to the current source 911.

It should be noted that the control switches 907 may be optional to the systems and methods disclosed herein. In some configurations, the control switches 907 may not be included in the dimmer 960. In other configurations, the control switches 907 may be used to enable all of or parts of the current sources 911. For instance, a signal 905 may be provided by a register to control the number of current sources 911 that are active, thus setting a full scale current value. In one example, there may be 25 identical current sources 911 and the signal 905 may be a 5-bit signal.

The amplified, filtered signal (passed through the control switches 907, for example), may be provided to the current source 911. The current source 911 includes a transistor 913 and a resistor 915. The current source 911 may be coupled to ground 917 and to the light source 954. The current source 911 may provide an electronic signal 968 (e.g., bias current) to control the light source 954. In some configurations, the light source 954 may be a backlight (e.g., a string of light emitting diodes) for a liquid crystal display panel.

When in a digital dimming mode, the monotonic multiplied modulated signal B 984*b* may control the first switch 988, the fourth switch 901 and the fifth switch 909 in order to directly modulate the electronic signal 968 (e.g., bias current). The fourth switch 901 and the fifth switch 909 may be controlled via the second inverter 998. Controlling the first switch 988, the fourth switch 901 and the fifth switch 909 may have the effect of switching the electronic signal 968 (e.g., the bias current) provided by the current source 911 on and off. For example, when monotonic multiplied modulated signal B 984*b* is high, the analog dimming circuitry (e.g., the second switch 990, third switch 994 and the first inverter 992) may be bypassed to drive the amplifier 903, the control switches 907 and the current source 911. However, when monotonic multiplied modulated signal B 984*b* is low, the current source 911 may be bypassed. Thus, the current source 911 may be switched on and off for direct modulation of the electronic signal 968 (e.g., bias current).

Figure 10:
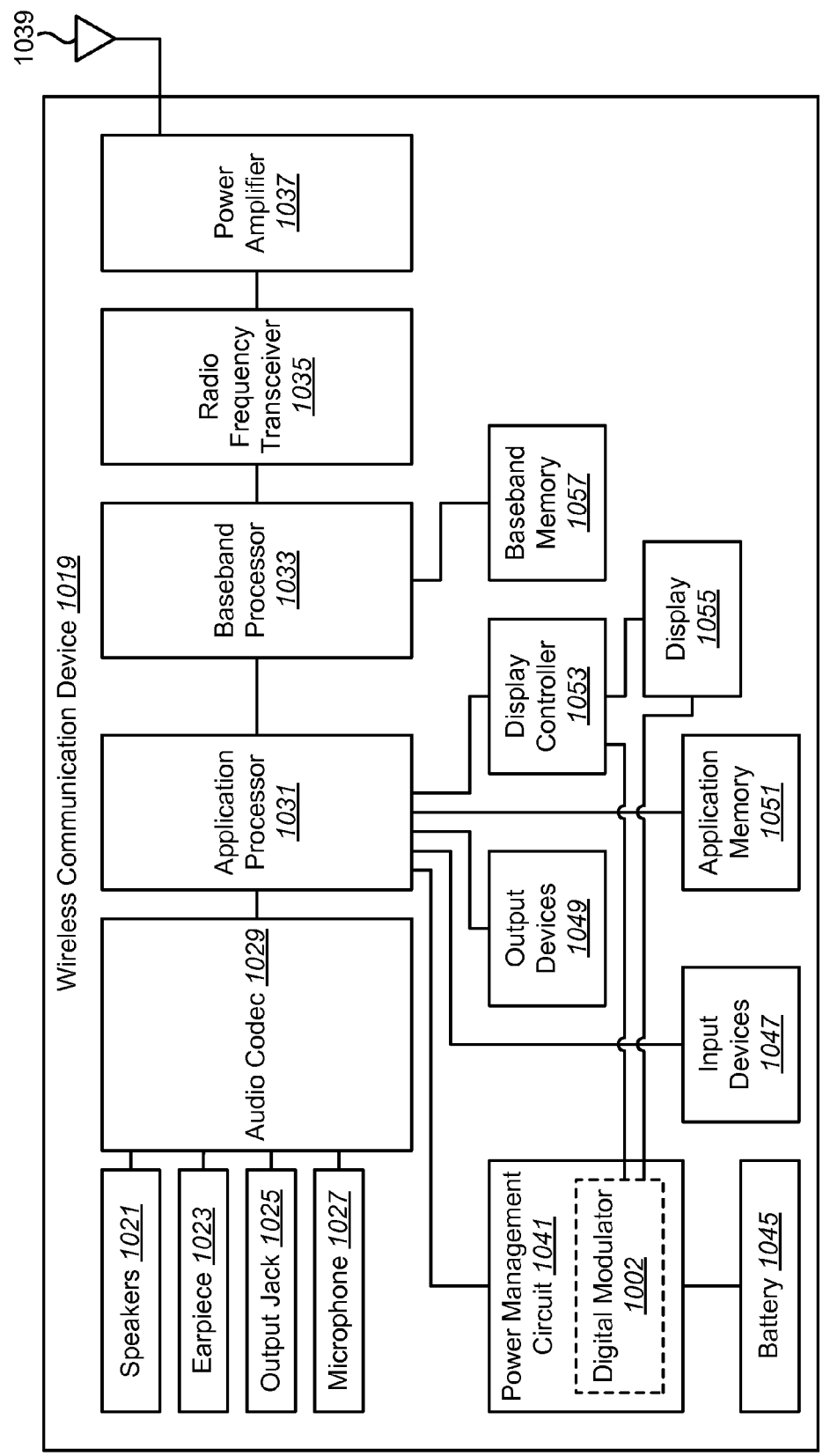
FIG. 10 is a block diagram illustrating one configuration of a wireless communication device in which systems and methods for performing digital modulation may be implemented.

FIG. 10 is a block diagram illustrating one configuration of a wireless communication device 1019 in which systems and methods for performing digital modulation may be implemented. The wireless communication device 1019 illustrated in FIG. 10 may include one or more of the digital modulators 102, 302, 402, 502, 602, 802 and/or other devices/circuitries (e.g., light sensors, display drivers, light sources, etc.) described above. The wireless communication device 1019 may include an application processor 1031. The application processor 1031 generally processes instructions (e.g., runs programs) to perform functions on the wireless communication device 1019. The application processor 1031 may be coupled to an audio coder/decoder (codec) 1029.

The audio codec 1029 may be an electronic device (e.g., integrated circuit) used for coding and/or decoding audio signals. The audio codec 1029 may be coupled to one or more speakers 1021, an earpiece 1023, an output jack 1025 and/or one or more microphones 1027. The speakers 1021 may include one or more electro-acoustic transducers that convert electrical or electronic signals into acoustic signals. For example, the speakers 1021 may be used to play music or output a speakerphone conversation, etc. The earpiece 1023 may be another speaker or electro-acoustic transducer that can be used to output acoustic signals (e.g., speech signals) to a user. For example, the earpiece 1023 may be used such that only a user may reliably hear the acoustic signal. The output jack 1025 may be used for coupling other devices to the wireless communication device 1019 for outputting audio, such as headphones. The speakers 1021, earpiece 1023 and/or output jack 1025 may generally be used for outputting an audio signal from the audio codec 1029. The one or more microphones 1027 may be at least one acousto-electric transducer that converts an acoustic signal (such as a user's voice) into electrical or electronic signals that are provided to the audio codec 1029.

The application processor 1031 may also be coupled to a power management circuit 1041. One example of a power management circuit 1041 is a power management integrated circuit (PMIC), which may be used to manage the electrical power consumption of the wireless communication device 1019. The power management circuit 1041 may be coupled to a battery 1045. The battery 1045 may generally provide electrical power to the wireless communication device 1019. For example, the battery 1045 and/or the power management circuit 1041 may be coupled to one or more of the elements included in the wireless communication device 1019.

The power management circuit 1041 may include a digital modulator 1002. The digital modulator 1002 may be configured similarly to one or more of the digital modulators 102, 302, 402, 502, 602, 802 described herein. Additionally or alternatively, the digital modulator 1002 may perform one or more of the methods 200, 700 and/or one or more of the functions described in connection with one or more of the digital modulators 102, 302, 402, 502, 602, 802 described above. In some configurations, the digital modulator 1002 may be alternatively implemented independently from the power management circuit 1041. As illustrated in FIG. 10, the digital modulator 1002 may be coupled to the display controller 1053 and to the display 1055 in some configurations. For example, the display controller 1053 may be one example of the display driver 652 described in connection with FIG. 6. Additionally or alternatively, the display 1055 may include a light source 654, 954 as described above. It should be noted that a dimmer 660, 960 may also be coupled between the digital modulator 1002 and the display 1055 in some configurations in the wireless communication device 1019. For instance, a dimmer 660, 960 may be implemented as part of the power management circuit 1041, may be integrated into the display 1055 or may be implemented independently.

The application processor 1031 may be coupled to one or more input devices 1047 for receiving input. Examples of input devices 1047 include infrared sensors, image sensors, accelerometers, touch sensors, keypads, etc. The input devices 1047 may allow user interaction with the wireless communication device 1019. The application processor 1031 may also be coupled to one or more output devices 1049. Examples of output devices 1049 include printers, projectors, screens, haptic devices, etc. The output devices 1049 may allow the wireless communication device 1019 to produce output that may be experienced by a user.

The application processor 1031 may be coupled to application memory 1051. The application memory 1051 may be any electronic device that is capable of storing electronic information. Examples of application memory 1051 include double data rate synchronous dynamic random access memory (DDRAM), synchronous dynamic random access memory (SDRAM), flash memory, etc. The application memory 1051 may provide storage for the application processor 1031. For instance, the application memory 1051 may store data and/or instructions for the functioning of programs that are run on the application processor 1031.

The application processor 1031 may be coupled to a display controller 1053, which in turn may be coupled to a display 1055. The display controller 1053 may be a hardware block that is used to generate images on the display 1055. For example, the display controller 1053 may translate instructions and/or data from the application processor 1031 into images that can be presented on the display 1055. Examples of the display 1055 include liquid crystal display (LCD) panels, light emitting diode (LED) panels, cathode ray tube (CRT) displays, plasma displays, etc.

The application processor 1031 may be coupled to a baseband processor 1033. The baseband processor 1033 generally processes communication signals. For example, the baseband processor 1033 may demodulate and/or decode received signals. Additionally or alternatively, the baseband processor 1033 may encode and/or modulate signals in preparation for transmission.

The baseband processor 1033 may be coupled to baseband memory 1057. The baseband memory 1057 may be any electronic device capable of storing electronic information, such as SDRAM, DDRAM, flash memory, etc. The baseband processor 1033 may read information (e.g., instructions and/or data) from and/or write information to the baseband memory 1057. Additionally or alternatively, the baseband processor 1033 may use instructions and/or data stored in the baseband memory 1057 to perform communication operations.

The baseband processor 1033 may be coupled to a radio frequency (RF) transceiver 1035. The RF transceiver 1035 may be coupled to a power amplifier 1037 and one or more antennas 1039. The RF transceiver 1035 may transmit and/or receive radio frequency signals. For example, the RF transceiver 1035 may transmit an RF signal using a power amplifier 1037 and one or more antennas 1039. The RF transceiver 1035 may also receive RF signals using the one or more antennas 1039.

Figure 11:
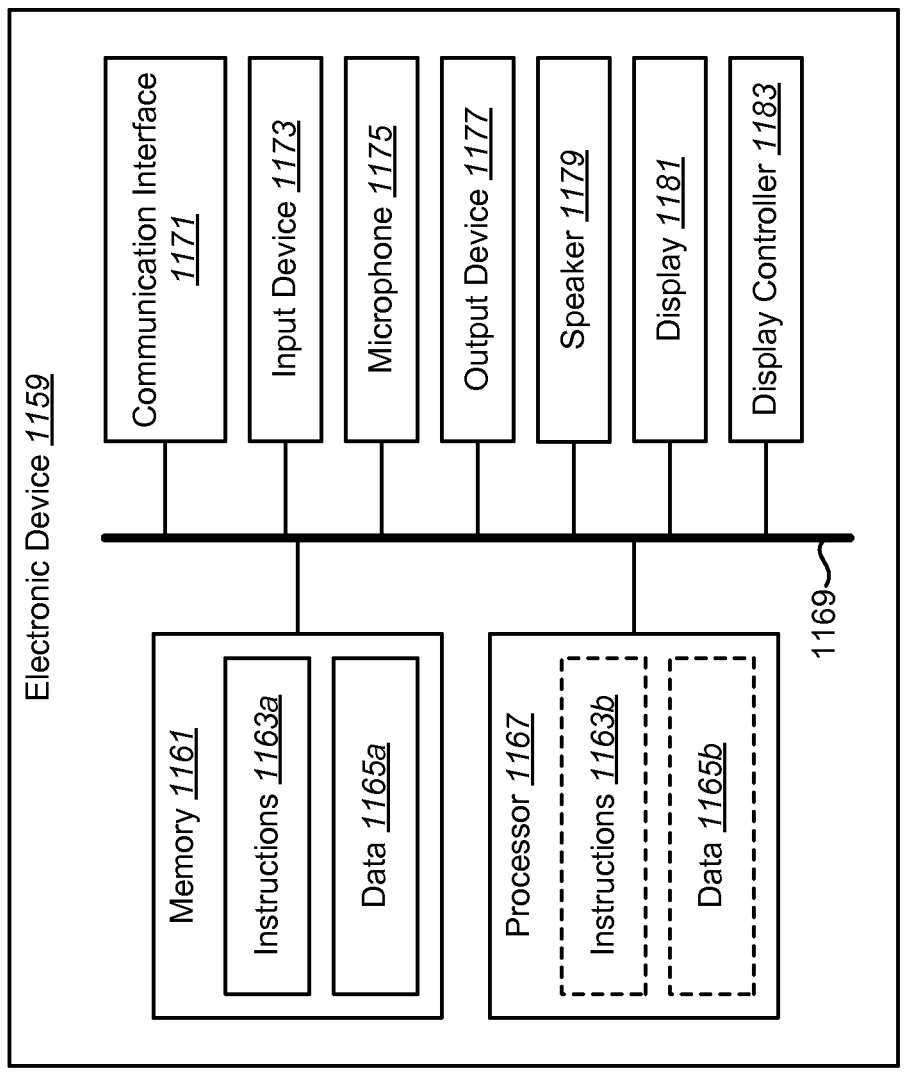
FIG. 11 illustrates various components that may be utilized in an electronic device.

FIG. 11 illustrates various components that may be utilized in an electronic device 1159. The illustrated components may be located within the same physical structure or in separate housings or structures. The electronic device 1159 described in connection with FIG. 11 may include one or more of the digital modulators 102, 302, 402, 502, 602, 802 and/or other devices/circuitries (e.g., light sensors, display drivers, light sources, etc.) described above. Additionally or alternatively, the electronic device 1159 may be implemented in accordance with one or more of the electronic device 600 and the wireless communication device 1019 described herein. The electronic device 1159 includes a processor 1167. The processor 1167 may be a general purpose single- or multi-chip microprocessor (e.g., an ARM), a special purpose microprocessor (e.g., a digital signal processor (DSP)), a microcontroller, a programmable gate array, etc. The processor 1167 may be referred to as a central processing unit (CPU). Although just a single processor 1167 is shown in the electronic device 1159 of FIG. 11, in an alternative configuration, a combination of processors (e.g., an ARM and DSP) could be used.

The electronic device 1159 also includes memory 1161 in electronic communication with the processor 1167. That is, the processor 1167 can read information from and/or write information to the memory 1161. The memory 1161 may be any electronic component capable of storing electronic information. The memory 1161 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1165a and instructions 1163a may be stored in the memory 1161. The instructions 1163a may include one or more programs, routines, sub-routines, functions, procedures, etc. The instructions 1163a may include a single computer-readable statement or many computer-readable statements. The instructions 1163a may be executable by the processor 1167 to implement one or more of the methods 200, 700 described above. Executing the instructions 1163a may involve the use of the data 1165a that is stored in the memory 1161. FIG. 11 shows some instructions 1163b and data 1165b being loaded into the processor 1167 (which may come from instructions 1163a and data 1165a).

The electronic device 1159 may also include one or more communication interfaces 1171 for communicating with other electronic devices. The communication interfaces 1171 may be based on wired communication technology, wireless communication technology, or both. Examples of different types of communication interfaces 1171 include a serial port, a parallel port, a Universal Serial Bus (USB), an Ethernet adapter, an Institute of Electrical and Electronics Engineers (IEEE) 1394 bus interface, a small computer system interface (SCSI) bus interface, an infrared (IR) communication port, a Bluetooth wireless communication adapter, and so forth.

The electronic device 1159 may also include one or more input devices 1173 and one or more output devices 1177. Examples of different kinds of input devices 1173 include a keyboard, mouse, microphone, remote control device, button, joystick, trackball, touchpad, lightpen, etc. For instance, the electronic device 1159 may include one or more microphones 1175 for capturing acoustic signals. In one configuration, a microphone 1175 may be a transducer that converts acoustic signals (e.g., voice, speech) into electrical or electronic signals. Examples of different kinds of output devices 1177 include a speaker, printer, etc. For instance, the electronic device 1159 may include one or more speakers 1179. In one configuration, a speaker 1179 may be a transducer that converts electrical or electronic signals into acoustic signals. One specific type of output device which may be typically included in an electronic device 1159 is a display device 1181. Display devices 1181 used with configurations disclosed herein may utilize any suitable image projection technology, such as a cathode ray tube (CRT), liquid crystal display (LCD), light-emitting diode (LED), gas plasma, electroluminescence, or the like. A display controller 1183 may also be provided, for converting data stored in the memory 1161 into text, graphics, and/or moving images (as appropriate) shown on the display device 1181.

The various components of the electronic device 1159 may be coupled together by one or more buses, which may include a power bus, a control signal bus, a status signal bus, a data bus, etc. For simplicity, the various buses are illustrated in FIG. 11 as a bus system 1169. It should be noted that FIG. 11 illustrates only one possible configuration of an electronic device 1159. Various other architectures and components may be utilized.

Figure 12:
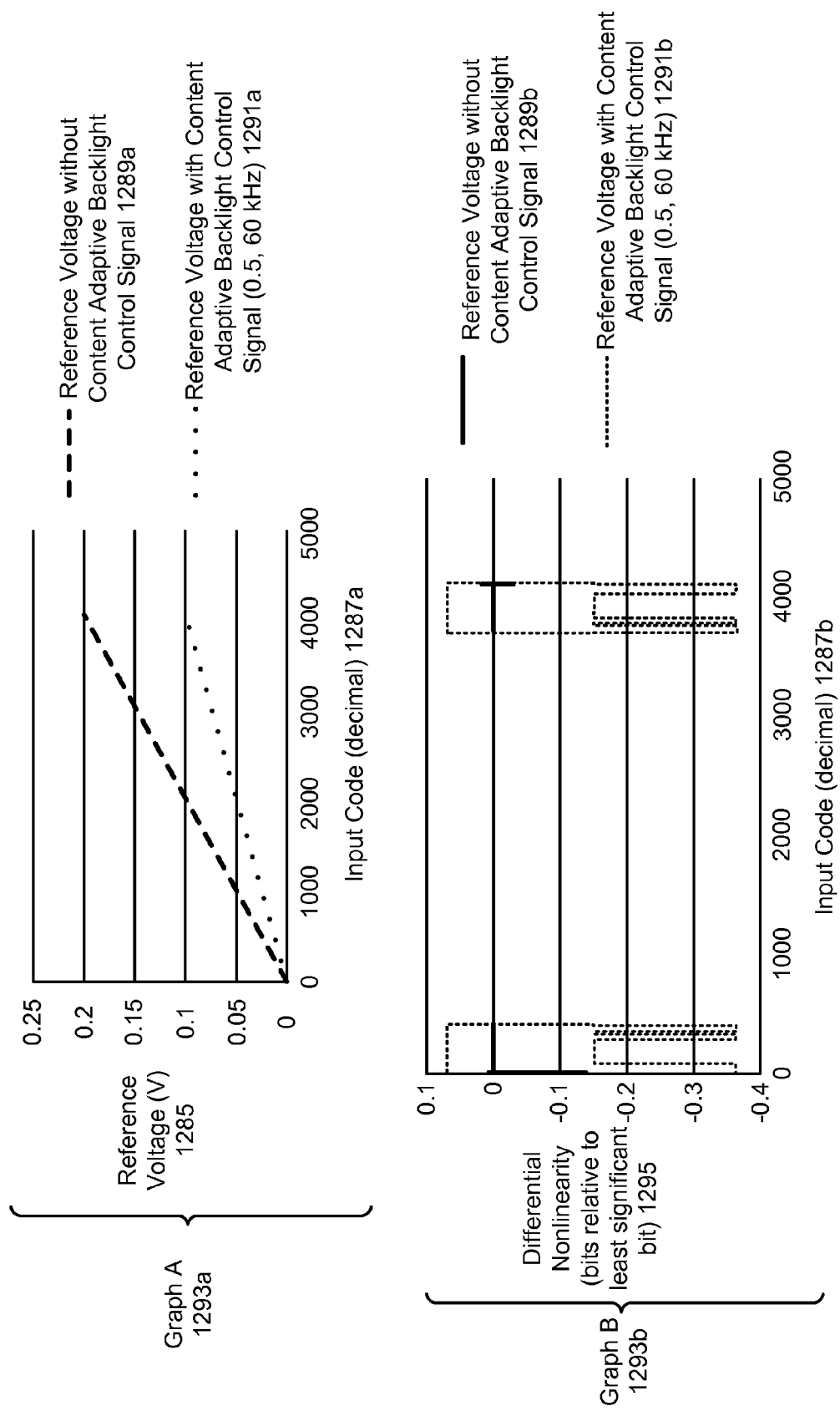
FIG. 12 is a diagram including graphs illustrating digital modulator linearity.

FIG. 12 is a diagram including graphs illustrating digital modulator linearity. In particular, FIG. 12 illustrates examples of digital modulator linearity with and without a content adaptive backlight control signal. The content adaptive backlight control signal may be one example of the second signal 106 described in connection with FIG. 1.

In FIG. 12, graph A 1293a illustrates a reference voltage 1285 in volts (V) on the vertical axis and an input code 1287a (e.g., a primary input code) in decimal on the horizontal axis. Graph A 1293a illustrates a linear response of the digital modulator for a reference voltage without a content adaptive backlight control signal 1289a and a reference voltage with a content adaptive backlight control signal 1291a. For example, the content adaptive backlight control signal illustrated in graph A 1293a may have a duty cycle of 50% (0.5) with an input frequency of 60 kHz.

In FIG. 12, graph B 1293b illustrates differential nonlinearity 1295 in bits relative to a least significant bit on the vertical axis and an input code 1287b (e.g., a primary input code) in decimal on the horizontal axis. In particular, graph B 1293b illustrates the differential nonlinearity for a reference voltage without a content adaptive backlight control signal 1289b and a reference voltage with a content adaptive backlight control signal 1291b. For example, the content adaptive backlight control signal illustrated in graph B 1293b may have a duty cycle of 50% (0.5) with an input frequency of 60 kHz.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

It should be noted that one or more of the features, functions, procedures, components, elements, structures, etc., described in connection with any one of the configurations described herein may be combined with one or more of the functions, procedures, components, elements, structures, etc., described in connection with any of the other configurations described herein, where compatible. In other words, any compatible combination of the functions, procedures, components, elements, etc., described herein may be implemented in accordance with the systems and methods disclosed herein.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. Circuitry for performing digital modulation, comprising:
    a digital modulator, wherein the digital modulator receives a first signal with a first duty cycle, receives a second signal with a second duty cycle, and produces a monotonic multiplied modulated signal based on the first signal and the second signal, wherein the second signal is a single-bit modulation signal, and wherein the digital modulator utilizes the second signal to control a hold state of an accumulator.

2. The circuitry of claim 1, wherein the second signal is received from an external source.

3. The circuitry of claim 1, wherein the monotonic multiplied modulated signal is a pulse-width modulated signal or a sigma-delta modulated signal.

4. The circuitry of claim 1, wherein the digital modulator provides the monotonic multiplied modulated signal to a dimmer.

5. The circuitry of claim 4, wherein the dimmer performs at least one of analog dimming and digital dimming based on the monotonic multiplied modulated signal.

6. The circuitry of claim 1, wherein a third duty cycle of the monotonic multiplied modulated signal is a product of the first duty cycle and the second duty cycle.

7. The circuitry of claim 1, wherein the digital modulator comprises:
    a first adder that subtracts an accumulator output from the first signal;
    an accumulator coupled to the first adder, wherein the accumulator provides the accumulator output based on a first adder output and the second signal; and
    an AND gate coupled to the accumulator, wherein the AND gate produces the monotonic multiplied modulated signal based on the accumulator output and the second signal.

8. The circuitry of claim 7, wherein the accumulator comprises:
    a second adder coupled to the first adder, wherein the second adder adds the first adder output to the accumulator output; and
    a delay coupled to the second adder and to the AND gate, wherein the delay delays a second adder output.

9. The circuitry of claim 7, wherein the digital modulator further comprises a truncator coupled to the accumulator and to the AND gate, wherein the truncator truncates the accumulator output.

10. The circuitry of claim 7, wherein the digital modulator operates in a sigma-delta modulation mode or a pulse-width modulation mode based on a mode signal.

11. A method for performing digital modulation by circuitry, comprising:
    receiving a first signal with a first duty cycle;
    receiving a second signal with a second duty cycle;
    producing a monotonic multiplied modulated signal based on the first signal and the second signal, wherein the second signal is a single-bit modulation signal; and
    utilizing the second signal to control a hold state of an accumulator.

12. The method of claim 11, wherein the second signal is received from an external source.

13. The method of claim 11, wherein the monotonic multiplied modulated signal is a pulse-width modulated signal or a sigma-delta modulated signal.

14. The method of claim 11, further comprising providing the monotonic multiplied modulated signal to a dimmer.

15. The method of claim 14, wherein the dimmer performs at least one of analog dimming and digital dimming based on the monotonic multiplied modulated signal.

16. The method of claim 11, wherein a third duty cycle of the monotonic multiplied modulated signal is a product of the first duty cycle and the second duty cycle.

17. The method of claim 11, wherein the circuitry comprises:
- a first adder that subtracts an accumulator output from the first signal;
- an accumulator coupled to the first adder, wherein the accumulator provides the accumulator output based on a first adder output and the second signal; and
- an AND gate coupled to the accumulator, wherein the AND gate produces the monotonic multiplied modulated signal based on the accumulator output and the second signal.

18. The method of claim 17, wherein the accumulator comprises:
- a second adder coupled to the first adder, wherein the second adder adds the first adder output to the accumulator output; and
- a delay coupled to the second adder and to the AND gate, wherein the delay delays a second adder output.

19. The method of claim 17, wherein the circuitry further comprises a truncator coupled to the accumulator and to the AND gate, wherein the truncator truncates the accumulator output.

20. The method of claim 17, wherein the circuitry operates in a sigma-delta modulation mode or a pulse-width modulation mode based on a mode signal.

21. A computer-program product for performing digital modulation, comprising a non-transitory tangible computer-readable medium having instructions thereon, the instructions comprising:
- code for causing circuitry to receive a first signal with a first duty cycle;
- code for causing the circuitry to receive a second signal with a second duty cycle;
- code for causing the circuitry to produce a monotonic multiplied modulated signal based on the first signal and the second signal, wherein the second signal is a single-bit modulation signal; and
- code for causing the circuitry to utilize the second signal to control a hold state of an accumulator.

22. The computer-program product of claim 21, wherein the second signal is received from an external source.

23. The computer-program product of claim 21, wherein the monotonic multiplied modulated signal is a pulse-width modulated signal or a sigma-delta modulated signal.

24. The computer-program product of claim 21, further comprising code for causing the circuitry to provide the monotonic multiplied modulated signal to a dimmer.

25. The computer-program product of claim 24, wherein the dimmer performs at least one of analog dimming and digital dimming based on the monotonic multiplied modulated signal.

26. The computer-program product of claim 21, wherein a third duty cycle of the monotonic multiplied modulated signal is a product of the first duty cycle and the second duty cycle.

27. The computer-program product of claim 21, wherein the circuitry comprises:
- a first adder that subtracts an accumulator output from the first signal;
- an accumulator coupled to the first adder, wherein the accumulator provides the accumulator output based on a first adder output and the second signal; and
- an AND gate coupled to the accumulator, wherein the AND gate produces the monotonic multiplied modulated signal based on the accumulator output and the second signal.

28. The computer-program product of claim 27, wherein the accumulator comprises:
- a second adder coupled to the first adder, wherein the second adder adds the first adder output to the accumulator output; and
- a delay coupled to the second adder and to the AND gate, wherein the delay delays a second adder output.

29. The computer-program product of claim 27, wherein the circuitry further comprises a truncator coupled to the accumulator and to the AND gate, wherein the truncator truncates the accumulator output.

30. The computer-program product of claim 27, wherein the circuitry operates in a sigma-delta modulation mode or a pulse-width modulation mode based on a mode signal.

31. An apparatus for performing digital modulation, comprising:
- means for receiving a first signal with a first duty cycle;
- means for receiving a second signal with a second duty cycle;
- means for producing a monotonic multiplied modulated signal based on the first signal and the second signal, wherein the second signal is a single-bit modulation signal; and
- means for utilizing the second signal to control a hold state of an accumulator.

32. The apparatus of claim 31, wherein the second signal is received from an external source.

33. The apparatus of claim 31, wherein the monotonic multiplied modulated signal is a pulse-width modulated signal or a sigma-delta modulated signal.

34. The apparatus of claim 31, further comprising means for providing the monotonic multiplied modulated signal to means for dimming.

35. The apparatus of claim 34, wherein the means for dimming performs at least one of analog dimming and digital dimming based on the monotonic multiplied modulated signal.

36. The apparatus of claim 31, wherein a third duty cycle of the monotonic multiplied modulated signal is a product of the first duty cycle and the second duty cycle.

37. The apparatus of claim 31, wherein the means for producing a monotonic multiplied modulated signal comprises:
- a first adder that subtracts an accumulator output from the first signal;
- an accumulator coupled to the first adder, wherein the accumulator provides the accumulator output based on a first adder output and the second signal; and
- an AND gate coupled to the accumulator, wherein the AND gate produces the monotonic multiplied modulated signal based on the accumulator output and the second signal.

38. The apparatus of claim 37, wherein the accumulator comprises:
- a second adder coupled to the first adder, wherein the second adder adds the first adder output to the accumulator output; and
- a delay coupled to the second adder and to the AND gate, wherein the delay delays a second adder output.

39. The apparatus of claim 37, wherein the means for producing a monotonic multiplied modulated signal further comprises a truncator coupled to the accumulator and to the AND gate, wherein the truncator truncates the accumulator output.

40. The apparatus of claim 37, wherein the means for producing a monotonic multiplied modulated signal operates in a sigma-delta modulation mode or a pulse-width modulation mode based on a mode signal.

\* \* \* \* \*